(12) United States Patent
Abe et al.

(10) Patent No.: US 8,153,336 B2
(45) Date of Patent: Apr. 10, 2012

(54) PHOTOMASK SUBSTRATE, PHOTOMASK SUBSTRATE FORMING MEMBER, PHOTOMASK SUBSTRATE FABRICATING METHOD, PHOTOMASK, AND EXPOSING METHOD THAT USES THE PHOTOMASK

(75) Inventors: Tetsuya Abe, Sagamihara (JP); Yuhei Nitta, Yokohama (JP); Yukiyasu Kimura, Yokohama (JP)

(73) Assignee: Nikon Corporation, Tokyo (JP)

( * ) Notice: Subject to any disclaimer, the term of this patent is extended or adjusted under 35 U.S.C. 154(b) by 96 days.

(21) Appl. No.: 12/591,121

(22) Filed: Nov. 9, 2009

(65) Prior Publication Data

US 2010/0062350 A1    Mar. 11, 2010

Related U.S. Application Data

(63) Continuation of application No. PCT/JP2008/057718, filed on Apr. 22, 2008.

(30) Foreign Application Priority Data

May 9, 2007    (JP) ............................... P2007-124126

(51) Int. Cl.
*G03F 1/00* (2006.01)
(52) U.S. Cl. .......................................................... 430/5
(58) Field of Classification Search ...... 430/5; 428/426; 451/38
See application file for complete search history.

(56) References Cited

U.S. PATENT DOCUMENTS

| 4,883,525 A | 11/1989 | Buckley et al. |
| 6,537,844 B1 | 3/2003 | Itoh |
| 7,745,071 B2 * | 6/2010 | Shibano et al. ................. 430/5 |
| 2002/0050152 A1 | 5/2002 | Fujiwara et al. |
| 2003/0143403 A1 | 7/2003 | Shibano et al. |
| 2005/0092026 A1 | 5/2005 | Merola et al. |
| 2005/0244726 A1 | 11/2005 | Itoh |
| 2006/0081008 A1 | 4/2006 | Hirata et al. |

(Continued)

FOREIGN PATENT DOCUMENTS

CN    1389902 A    1/2003

(Continued)

OTHER PUBLICATIONS

European Search Report dated Mar. 25, 2010 and issued in corresponding European Patent Application 08751903.9.

(Continued)

*Primary Examiner* — Stephen Rosasco
(74) *Attorney, Agent, or Firm* — Staas & Halsey LLP

(57) ABSTRACT

A photomask substrate with a substantially uniform thickness comprises: a first surface, which is a continuous curved surface whereon a mask pattern is to be formed; and a second surface. The first surface exhibits a square shape that comprises an opposing pair of first set sides and an opposing pair of second set sides and has support parts at end parts along the first set sides. When the photomask substrate is held such that the first surface is in a substantially vertical state, a reference plane that is parallel to a tangential plane of the first surface at the center point of the first surface is defined on the photomask substrate side that is closer to the first surface than to the second surface. At this time, a first distance in the thickness direction between the reference plane and the center point of the first surface is shorter than second distances in the thickness direction between the reference plane and the midpoints of the second set sides.

19 Claims, 13 Drawing Sheets

U.S. PATENT DOCUMENTS

2006/0194126 A1  8/2006  Tanabe

FOREIGN PATENT DOCUMENTS

| | | |
|---|---|---|
| EP | 0 571 162 A1 | 11/1993 |
| EP | 1 829 836 A1 | 6/2006 |
| JP | 60-152026 | 8/1985 |
| JP | 3-44639 | 2/1991 |
| JP | 9-167736 | 6/1997 |
| JP | 2000-77321 | 3/2000 |
| JP | 2002-53330 | 2/2002 |
| JP | 2003-50458 | 2/2003 |
| JP | 2003-192363 | 7/2003 |
| JP | 2003-292346 | 10/2003 |
| JP | 2006-225249 | 8/2006 |
| WO | 02/32622 A1 | 4/2002 |
| WO | 2006/134855 A1 | 12/2006 |

OTHER PUBLICATIONS

English Translation of the International Preliminary Report on Patentability mailed Dec. 3, 2009 in corresponding International Patent Application PCT/JP2008/057718.

International Search Report mailed May 20, 2008 in corresponding International Search Report PCT/JP2008/057718.

* cited by examiner

PHOTOMASK SUBSTRATE, PHOTOMASK SUBSTRATE FORMING MEMBER, PHOTOMASK SUBSTRATE FABRICATING METHOD, PHOTOMASK, AND EXPOSING METHOD THAT USES THE PHOTOMASK

CROSS-REFERENCE TO RELATED APPLICATIONS

This application is a continuation application of International Application No. PCT/JP2008/057718 filed on Apr. 22, 2008, claiming the benefit of priority from Japanese Patent Application No. 2007-124126 filed on May 9, 2007, the entire contents of which are incorporated herein by reference.

BACKGROUND

1. Field

A device, such as a flat panel display (hereinbelow, called an FPD), is fabricated by using photolithographic technology to project with high accuracy a mask pattern formed on a photomask to a front surface of a device substrate, thereby exposing the device substrate with the mask pattern. Accordingly, if the photomask unfortunately deforms, the mask pattern formed thereon also deforms, which results in the unfortunate deformation of the image of the mask pattern projected to the device substrate as well.

2. Description of the Related Art

Accordingly, to increase the flatness of the photomask, research (See Japanese Patent Application Laid-Open Publication No. 2003-292346, Japanese Patent Application Laid-Open Publication No. 2004-359544 and Japanese Patent Application Laid-Open Publication No. 2005-262432) is being conducted on how to improve the planarity of the substrate through methods of fabrication that eliminate partially protruding portions of the photomask substrate.

Incidentally, in an exposure apparatus that fabricates devices such as FPDs by projecting a mask pattern formed on a photomask to a substrate, thereby exposing the substrate with the mask pattern, it is known to expose the substrate with the mask pattern formed on the photomask while the exposure apparatus holds the photomask substantially horizontally such that the surface whereon the mask pattern is formed faces downward. At that time, as a function of constraints owing to the configuration of the exposure apparatus, the photomask is supported along areas in the vicinity of one set of two opposing sides of the four sides that surround the lower surface of the photomask, namely, the surface whereon the mask pattern is formed. A photomask so supported deforms such that the lower surface of the supported area between the set of sides curves and sags downward owing to its self weight. Here, this deformation is called a first deformation. In addition, simultaneously, the vicinities of the unsupported two sides (i.e., free ends) deform such that they curve and sag downward even farther. Here, this deformation is called a second deformation. There is a risk that such deformation of the photomask might also cause, as explained above, deformation in the mask pattern formed on the lower surface of the photomask.

To accurately form an image of such a deformed mask pattern on the substrate and thereby expose the substrate with the mask pattern, a projection optical system of the exposure apparatus has an autofocus function. Nevertheless, while the depth of focus provided by the autofocus function of the projection optical system covers the first deformation, the effects produced by the second deformation tend to exceed the range of the depth of focus. In addition, as photomasks have increased in size, the second deformation has likewise increased markedly, further departing from the range of the depth of focus of the projection optical system, which is a problem.

Even if satisfactory planarity is achieved as recited in the studies disclosed in Patent Documents 1-3, such an approach cannot solve the problem of deformation that results from the self weight of the substrate.

SUMMARY

It is an object of an embodiment of the present invention to provide: a photomask substrate that can prevent deformation, specifically the second deformation of a photomask substrate that results from its self weight, of a desired mask pattern in the photomask substrate, and can project the mask pattern to a device substrate, thereby exposing the device substrate with the mask pattern; a photomask substrate forming member; a photomask substrate fabricating method; a photomask; and an exposing method that uses the photomask.

A photomask substrate of an embodiment in accordance with the present invention is a photomask substrate that consists of a plate shaped member with a substantially uniform thickness and comprises: a first surface, which is a continuous curved surface and whereon a mask pattern is to be formed; and a second surface, which opposes the first surface; wherein, the first surface exhibits a square shape that comprises an opposing pair of first set sides and an opposing pair of second set sides, which extend such that they communicate with the first set sides, and a support part, which is for supporting the photomask substrate at its end parts along the first set sides; when the photomask substrate is held such that the first surface is in a substantially vertical state, the point at which the axis that passes through the center of gravity of the photomask substrate and extends in the thickness direction of the photomask substrate intersects the first surface is designated as a center point of the first surface; and if a reference plane that is parallel to a tangential plane of the first surface at the center point is defined on the photomask substrate side that is closer to the first surface than to the second surface, then a first distance in the thickness direction between the reference plane and the center point of the first surface is shorter than second distances in the thickness direction between the reference plane and the midpoints of the second set sides. Here, the tangential plane in the present specification refers to the plane that includes all tangents to one point on the curved surface.

When the photomask substrate is held such that the first surface is substantially in the vertical state, the distances in the thickness direction between the reference plane and the portions of the second set sides on the first set sides may be shorter than the second distances. When the photomask substrate is held such that the first surface is substantially in the vertical state, the distances in the thickness direction between the reference plane and any points along the first set sides may be substantially the same.

When the photomask substrate is held such that the first surface is substantially in the vertical state, the distances in the thickness direction between the reference plane and midpoints of the first set sides may be substantially the same as the first distance.

When the photomask substrate is held such that the first surface is substantially in the vertical state, the distances in the thickness direction between the reference plane and the midpoints of the first set sides may be shorter than the first distance.

When the photomask substrate is held such that the first surface is substantially in the vertical state, the distances in the thickness direction between the reference plane and any points along the second set sides may be substantially the same.

The photomask substrate may comprise marks for discriminating the first surface and the second surface. The photomask substrate may be made of quartz glass.

A photomask according to an embodiment of the present invention is a photomask fabricated using the photomask substrate, wherein a mask pattern is formed on the first surface; and the photomask is supported by an exposure apparatus at the support parts such that the exposure light is projected from the second surface side.

An exposing method according to an embodiment of the present invention is an exposing method that exposes a wafer with the mask pattern formed on the photomask and comprises the step of: performing an exposure in the state wherein the support parts are supported by a photomask support member of the exposure apparatus such that the exposure light is projected from the surface on the side opposite the surface whereon the mask pattern of the photomask is formed, and the surface whereon the mask pattern is formed faces toward the wafer.

A photomask substrate forming member according to an embodiment of the present invention is a photomask substrate forming member that shapes a plate shaped member and comprises: a forming surface that is a continuous curved surface for shaping the plate shaped member that exhibits a square shape that comprises an opposing pair of first set sides and an opposing pair of second set sides, which extend such that they communicate with the first set sides; wherein, the intersection point between the straight line that connects the midpoints of the first set sides and the straight line that connects the midpoints of the second set sides is designated as a center point of the forming surface; and if a reference plane that is parallel to a tangential plane of the forming surface at the center point is defined on the forming surface side of the forming member spaced apart therefrom, then a first distance in the normal line direction of the tangential plane between the reference plane and the center point of the forming surface is shorter than the second distances in the normal line direction between the reference plane and the midpoints of the second set sides.

The distances in the normal line direction between the reference plane and the portions of the second set sides on the first set sides may be shorter than the second distances. In addition, the distances in the normal line direction between the reference plane and any points along the first set sides may be substantially the same.

The distances in the normal line direction between the reference plane and midpoints of the first set sides may be substantially the same as the first distance. The distances in the normal line direction between the reference plane and the midpoints of the first set sides may be shorter than the first distance.

The distances in the normal line direction between the reference plane and any points along the second set sides may be substantially the same. The photomask substrate forming member may be made of graphite.

A photomask substrate fabricating method according to an embodiment of the present invention comprises the steps of: preparing the forming member; preparing a plate shaped member with a substantially uniform thickness that comprises a first surface, whereon a mask pattern is to be formed, and a second surface, which opposes the first surface; disposing the plate shaped member and the forming member in a heat treatment furnace in the state wherein the second surface of the plate shaped member is supported by a forming surface of the forming member; and after heating the interior of the heat treatment furnace such that the temperature of the plate shaped member reaches a prescribed temperature, lowering the temperature of the plate shaped member.

A photomask substrate fabricating method according to an embodiment of the present invention comprises the steps of: preparing a plate shaped member with a substantially uniform thickness that comprises a first surface, whereon a mask pattern is to be formed, and a second surface, which opposes the first surface; disposing the plate shaped member and the forming member in a heat treatment furnace in the state wherein end part areas along one set of sides of two sets of opposing sides that constitute the second surface of the plate shaped member are supported by support parts such that the plate shaped member is substantially horizontal; and after heating the interior of the heat treatment furnace such that the temperature of the plate shaped member reaches a prescribed temperature, lowering the temperature of the plate shaped member. In this case, the support member may be made of graphite.

The plate shaped member may be made of quartz glass.

In addition, the embodiment according to a first aspect of the invention provides a photomask substrate, wherein a first surface for forming a mask pattern is a rectangle with a diagonal line length of 1,200 mm or greater; the thickness of the photomask substrate is 8 mm or greater; the photomask substrate is held in the state wherein the first surface is substantially vertical; and if a reference plane is defined as an arbitrary plane that is parallel to the vicinity of the center of the first surface and is located at a position that is sufficiently spaced apart from the first surface on the near side of the first surface, then distances from the vicinities of end parts of a first centerline, which is one of two centerlines that constitute the first surface, to the reference plane are longer by 30-100 µm than a distance from the vicinity of the center of the first centerline to the reference plane.

The exposure is performed in the state wherein the photomask is supported by the exposure apparatus in the vicinities of the one set of sides parallel to the first centerline. Accordingly, this configuration prevents a second deformation from increasing in the vicinities of center parts of the two unsupported sides (i.e., free ends) of the photomask during an exposure, which makes it possible to expose a glass substrate with the mask pattern with high accuracy even if the photomask is large.

The embodiment according to a second aspect of the invention provides a photomask substrate according to the first aspect of the invention, wherein the distances from any points in the vicinities of the first set sides, which are one set of sides parallel to the first centerline, to the reference plane are substantially the same.

The exposure is performed in the state wherein the photomask is supported by the exposure apparatus in the vicinities of the one set of sides parallel to the first centerline. According to this configuration, a photomask substrate has a shape that compensates for the second deformation that occurs in the vicinities of the center parts of the two unsupported sides (i.e., free ends) of the photomask during an exposure. Accordingly, the second deformation is prevented from occurring in the free ends during an exposure, which makes it possible to expose a glass substrate with the mask pattern with even higher accuracy even if the photomask is large.

The embodiment according to a third aspect of the invention provides a photomask substrate according the first and second aspects of the invention, wherein the distance from the vicinity of a center part of the second centerline to the reference plane is longer by 150-1500 μm than the distances from the vicinities of the end parts of the second centerline to the reference plane.

According to this configuration, the photomask substrate has a shape that during an exposure simultaneously compensates for a first deformation, which occurs in an area between support areas, and for the second deformation, which occurs in the vicinities of the center parts of the free ends. Accordingly, it is possible to expose a glass substrate with the mask pattern with extremely high accuracy even if the photomask is large.

The embodiment according to the present invention can provide: a photomask substrate that can prevent deformation, specifically the second deformation of a photomask substrate that results from its self weight, of a desired mask pattern in the photomask substrate, and can project the mask pattern to a device substrate, thereby exposing the device substrate with the mask pattern; a photomask substrate forming member; a photomask substrate fabricating method; a photomask; and an exposing method that uses the photomask.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

The following text explains the embodiments of the present invention, referencing the drawings; however, the present invention is not limited thereto. Furthermore, in the explanation, identical elements, or elements that have identical functions, are assigned the same symbols, and redundant explanations thereof are therefore omitted. In addition, the symbol assigned to each element is merely illustrative of the element, and the symbol does not limit the element.

First Embodiment

Figure 7:
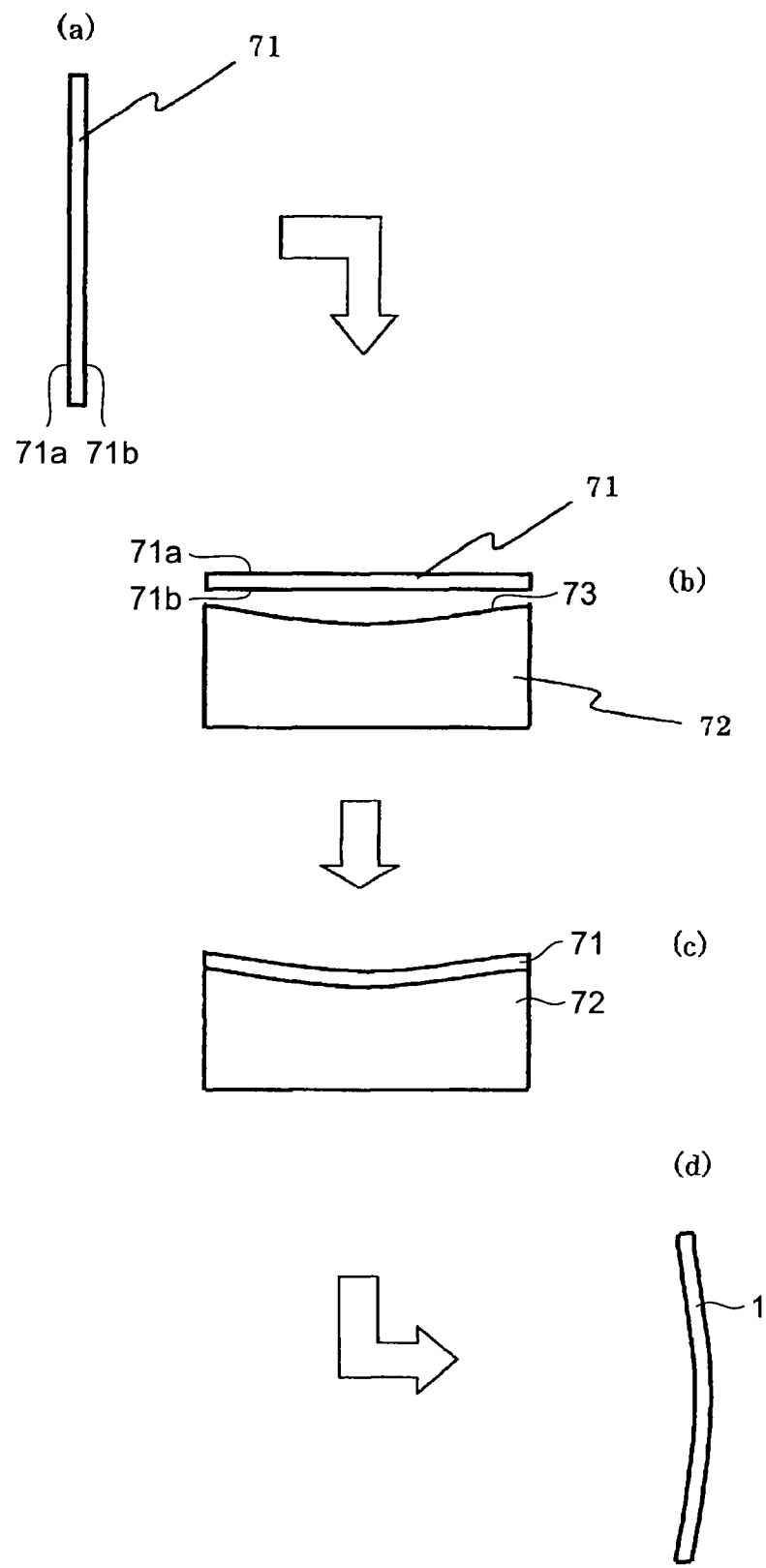
FIG. 7 is a conceptual diagram that shows a photomask substrate fabricating method according to the first embodiment, the second embodiment, and the third embodiment.

FIG. 7 is a schematic diagram that shows a photomask substrate fabricating method according to a first embodiment. First, a quartz glass plate shaped member with a substantially uniform thickness and whose two opposing surfaces are substantially parallel is prepared. Each of the two opposing surfaces is a rectangle whose size is defined by a longitudinal length of 1,220 mm and a latitudinal length of 1,400 mm; furthermore, the thickness is 13 mm. Both surfaces of the quartz glass plate shaped member are polished. A quartz glass plate shaped member 71 comprises: a first surface 71*a*, which is the surface of the two opposing surfaces whereon a mask pattern is to be formed; and a second surface 71*b* that, as the other surface, opposes the first surface 71*a*.

Next, a forming member 72 that is made of graphite and is used to form the quartz glass plate shaped member 71 is prepared.

Figure 4:
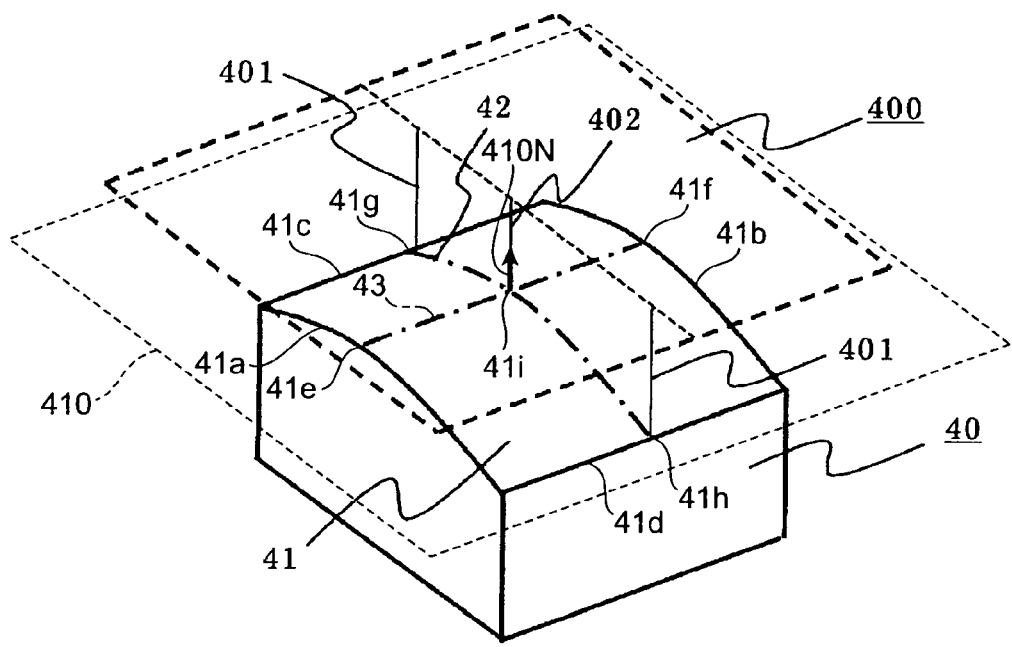
FIG. 4 is a conceptual diagram that shows a photomask substrate forming member according to the first embodiment.

The forming member 72 is the same as a forming member 40 shown in FIG. 4. The forming member 40 will now be explained, referencing FIG. 4. The thickness of the forming member 40 is approximately 100 mm, and the size of a forming surface 41 for forming the quartz glass plate shaped member 71 is substantially equal to that of the quartz glass plate shaped member 71 itself. The forming surface 41 is fabricated in advance such that its shape is as follows. Namely, if we define a reference plane 400 as an arbitrary plane that is parallel to the vicinity of the center of the forming surface 41 and located at a position sufficiently spaced apart from the forming surface 41 on the near side of the forming surface 41, then distances 401 from the vicinities of the end parts of a first centerline 42, which is one of two centerlines that constitute the forming surface 41 to the reference plane 400, are longer, by approximately 40 μm, than a distance 402 from the vicinity of the center of the first centerline 42 to the reference plane 400. In other words, if the forming member 40 is disposed such that its forming surface 41 faces upward, then, following along the first centerline 42, the front surface in the vicinities of those end parts is approximately 40 μm lower than the front surface in the vicinity of the center part.

Namely, the forming surface 41 is a continuous curved surface and exhibits a square shape that comprises an opposing pair of first set sides 41*a*, 41*b* and an opposing pair of second set sides 41*c*, 41*d*, which extend such that they communicate with the first set sides 41*a*, 41*b*. Here, the intersection point between a second centerline 43, which is a straight line that connects midpoints 41*e*, 41*f* of the first set sides 41*a*, 41*b*, and the first centerline 42, which is a straight line that connects midpoints 41*g*, 41*h* of the second set sides 41*c*, 41*d*, is designated as a center point 41*i* of the forming surface 41. At this time, the reference plane 400 is defined as being both parallel to a tangential plane 410 of the forming surface 41 at the center point 41*i* of the forming surface 41 and located on the forming surface 41 side of the forming member 40 spaced apart therefrom. As in the above definition, the tangential plane 410 of the forming surface 41 includes all tangents to the forming surface 41 at the center point 41*i*, wherein the center point 41*i* is one point on the forming surface 41.

The first distance 402 in a normal line direction 410N of the tangential plane 410 between the center point 41*i* of the forming surface 41 and the reference plane 400 is shorter than the second distances 401 in the normal line direction 410N between the midpoints 41*g*, 41*h* of the second set sides 41*c*, 41*d* and the reference plane 400. In addition, the distances

401 in the normal line direction 410N between the reference plane 400 and any points on the second set sides 41c, 41d are substantially the same.

As previously explained, the abovementioned shape is set in order to compensate for the deformation that occurs in the photomask, which is supported by the exposure apparatus, as a result of its self weight. Furthermore, the numerical value of approximately 40 μm varies with the size of the quartz glass plate shaped member 71. In addition, if a material other than quartz glass is used, then it is preferable to make appropriate modifications in accordance with that material's modulus of elasticity.

Next, the quartz glass plate shaped member 71 is mounted on a forming surface 73 of the graphite forming member 72 (see FIG. 7(b)). The quartz glass plate shaped member 71 elastically deforms owing to its self weight, and substantially its entire surface contacts the forming surface 73 of the graphite forming member 72. Consequently, the quartz glass plate shaped member 71 transitions to a stressed state. Furthermore, because the graphite forming member 72 is sufficiently thick, the deformation is on an order that can be ignored (FIG. 7(c)).

Next, the entire arrangement is stored in this state inside a heat treatment furnace. The temperature inside the heat treatment furnace is gradually raised to approximately 1,300° C. and then maintained thereat for a prescribed time. Thereby, the stress in the quartz glass plate shaped member 71 relaxes and the stress in the state wherein the entire surface of the quartz glass plate shaped member 71 contacts the forming surface 73 of the graphite forming member 72 becomes substantially zero. Since, prior to the heat treatment, the upper surface and the lower surface of the quartz glass plate shaped member 71 are substantially parallel, this relationship does not change even when the stress becomes zero. Furthermore, although the hold temperature is set to 1,300° C., a lower temperature is sufficient as long as the stress of the sample relaxes. In addition, if a material other than quartz glass is used, the temperature should be set such that the stress in that material relaxes.

When the relaxation of the stress of the quartz glass plate shaped member 71 is complete, the temperature in the heat treatment furnace is gradually decreased to room temperature and kept at room temperature for a prescribed time, after which the quartz glass plate shaped member 71 is removed from the heat treatment furnace. The quartz glass plate shaped member 71 transitions to a state wherein the shape of the forming surface 73 of the graphite forming member 72 has been transferred thereto, and thereby a photomask substrate 1 is complete.

Next, the degree of planarity of the completed photomask substrate 1 is measured. The surface to be measured is the surface on the side that did not contact the graphite forming member 72, namely, the first surface 71a of the quartz glass plate shaped member 71. The degree of planarity is measured using a noncontactual optical measuring apparatus in the state wherein it is vertically erect with respect to the photomask substrate 1. Thereby, it is possible to verify that the shape of the forming surface 73, which is a support surface of the graphite forming member 72, has been substantially transferred to the front surface of the photomask substrate 1.

Figure 1:
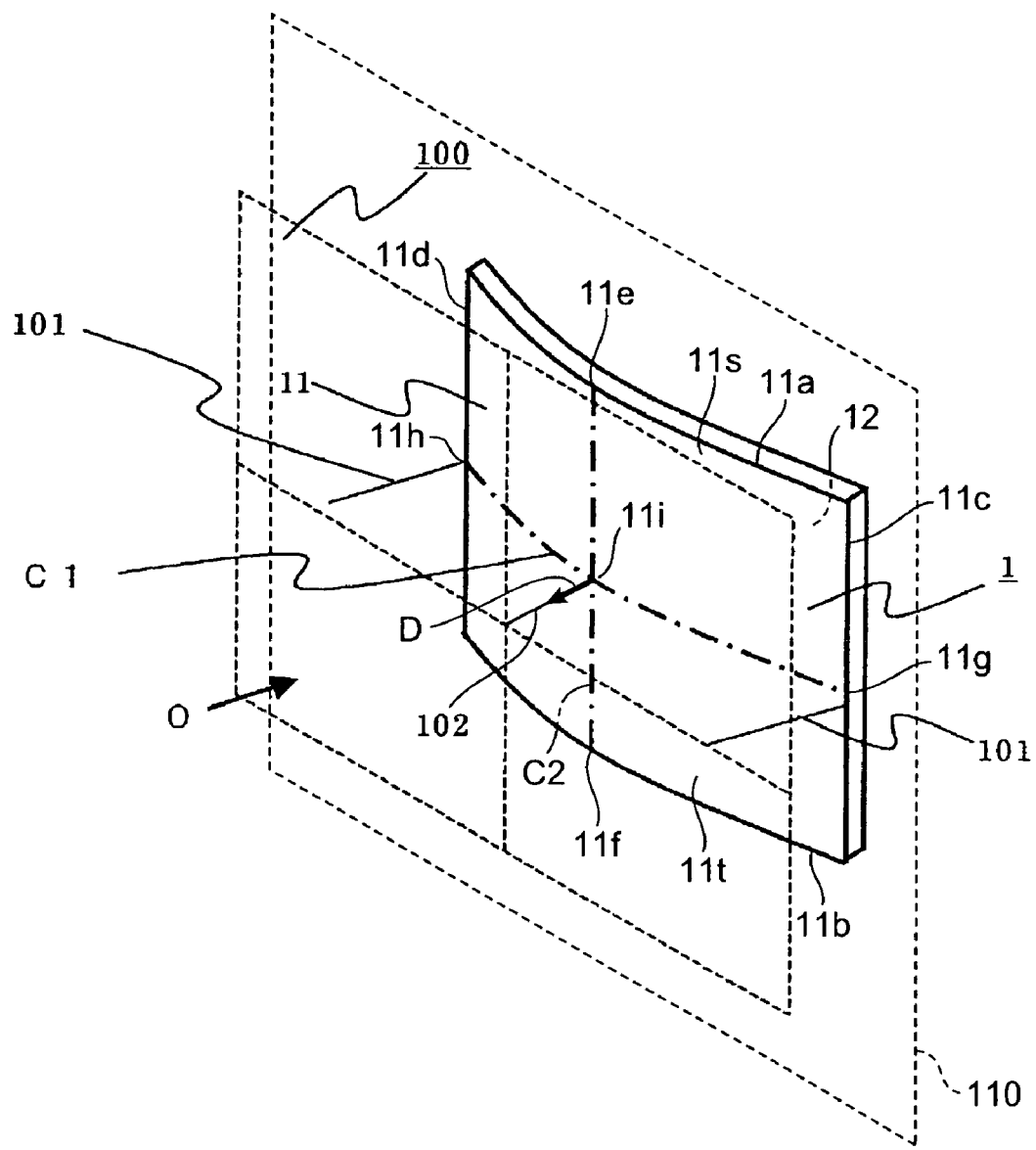
FIG. 1 is a conceptual diagram that shows a photomask substrate according to a first embodiment.

Namely, as shown in FIG. 1, if the completed photomask substrate 1 is held such that a first surface 11, whereon the mask pattern is to be formed, is substantially vertical and if we define a reference plane 100 as an arbitrary plane that is parallel to the vicinity of the center of the first surface 11 and located at a position sufficiently spaced apart from the first surface 11 on the near side of the first surface 11, then, viewed from an observation direction O, distances 101 from the vicinities of end parts of a first centerline C1, which is one of the two centerlines that constitute the first surface, to the reference plane 100 are longer by approximately 40 μm than a distance 102 from the vicinity of the center of the first centerline C1 to the reference plane 100.

Namely, the photomask substrate 1 is a plate shaped member with a substantially uniform thickness that has: the first surface 11, which is a continuous curved surface whereon the mask pattern is to be formed; and a second surface 12, which opposes the first surface 11. The first surface 11 exhibits a square shape that comprises an opposing pair of first set sides 11a, 11b and an opposing pair of second set sides 11c, 11d, which extend such that they communicate with the first set sides 11a, 11b. The first surface 11 has support parts 11s, 11t for supporting the photomask substrate 1 at its end parts along the first set sides 11a, 11b.

Here, let us consider the point in time in which the photomask substrate 1 is held such that the first surface 11 is substantially vertical. Furthermore, let the point at which an axis that passes through the center of gravity of the photomask substrate 1 and extends in a thickness direction D of the photomask substrate 1 intersects the first surface 11 be designated as a center point 11i of the first surface 11. Because the photomask substrate 1 is a plate shaped member with a substantially uniform thickness, the center point 11i is an intersection point between a second centerline C2, which is a straight line that connects midpoints 11e, 11f of the first set sides 11a, 11b, and the first centerline C1, which is a straight line that connects midpoints 11g, 11h of the second set sides 11c, 11d.

In addition, the reference plane 100 is defined as a plane that is parallel to a tangential plane 110 of the first surface 11 at the center point 11i and located on the side of the photomask substrate 1 that is closer to the first surface 11 than to the second surface 12. As defined above, the tangential plane 110 of the first surface 11 refers to the plane that includes all tangents to the first surface 11 at the center point 11i, wherein the center point 11i is one point on the first surface 11.

At this time, the first distance 102 in the thickness direction D between the center point 11i of the first surface 11 and the reference plane 100 is shorter than the second distances 101 in the thickness direction D between the midpoints 11g, 11h of the second set sides 11c, 11d and the reference plane 100. In addition, the distances 101 in the thickness direction D between the reference plane 100 and any points along the second set sides 11c, 11d are substantially the same.

The photomask substrate 1, the photomask substrate forming members 40 (72), and the photomask substrate fabricating method according to the present embodiment are useful when fabricating FPDs, such as liquid crystal panels.

An FPD, such as a liquid crystal panel, is fabricated by forming with high accuracy elements of the FPD on the front surface of a glass substrate. Consequently, photolithographic technology is used. Namely, a photomask, wherein a mask pattern is formed with high accuracy on a front surface of a flat plate shaped transparent substrate with excellent planarity, is illuminated with exposure light, an image of that mask pattern is formed on the glass substrate, which is coated in advance with a photoresist, the glass substrate is then developed, and thereby the resist pattern is formed on the glass substrate surface. Subsequently, the FPD is fabricated by undergoing a plurality of processes.

Incidentally, to increase the screen size of the FPD and to improve production efficiency, advances in increasing the size of FPD glass substrates are being made year by year, which have led to an increase in the size of photomasks for use in that production. In the near future, glass substrates will become extremely large, for example, 2,200 mm×2,500 mm, and the size of photomasks used to expose such glass substrates with mask patterns will also become extremely large, for example, 1,220 mm×1,400 mm with a thickness of 13 mm. However, the size increases will not stop there, and ever larger glass substrates and photomasks will be called for.

Figure 12:
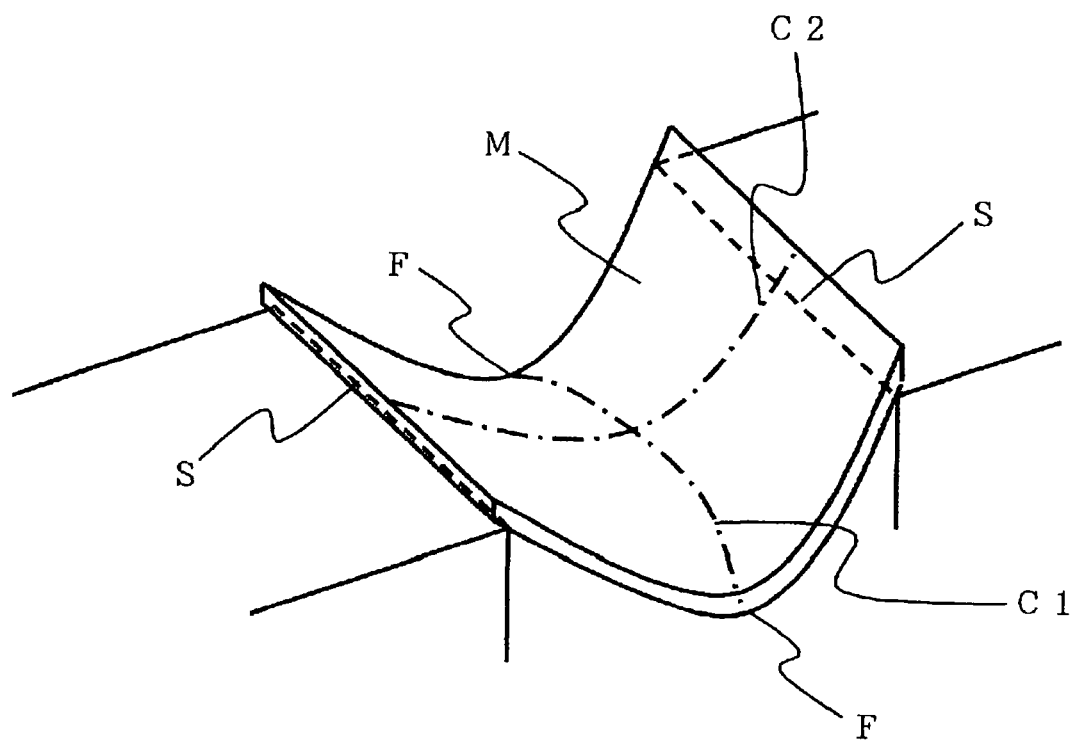
FIG. 12 is a conceptual diagram that shows an aspect of the deformation of the photomask.

The exposure wherein the substrate is exposed with the mask pattern formed on the photomask is performed while the exposure apparatus holds the photomask substantially horizontally such that the surface whereon the mask pattern is formed faces downward. At that time, as a function of constraints owing to the configuration of the exposure apparatus, the photomask is supported along areas in the vicinity of one set of two opposing sides of the four sides that surround the lower surface of the photomask, namely, the surface whereon the mask pattern is formed. A photomask so supported deforms such that the lower surface of the supported area between the set of sides curves and sags downward owing to its self weight. Here, this deformation is called a first deformation. In addition, simultaneously, the vicinities of the unsupported two sides (i.e., free ends) deform such that they curve and sag downward even farther. Here, this deformation is called a second deformation. This aspect is shown in FIG. 12. Namely, in FIG. 12, a photomask M sags downward in an area between support portions S at two locations, and simultaneously sags down farther in the vicinities of center parts of unsupported free ends F. This means that the deformation explained above also occurs in the mask pattern formed on the lower surface of the photomask. Furthermore, in FIG. 12, C1, C2 indicate the two centerlines of the surface whereon the mask pattern is formed; here, the centerline that is substantially parallel to the support portions S is called the first centerline C1, and the other centerline is called the second centerline C2.

The exposure apparatus is configured such that its projection optical system exposes a long, thin area. To accurately form a mask pattern so deformed on the glass substrate, which is the substrate of an FPD, and thereby expose the glass substrate with the mask pattern, the projection optical system of the exposure apparatus has an autofocus function.

The deformations explained above occur in the mask pattern formed on the photomask; however, the autofocus function, the photomask's directions of movement, and the like of exposure apparatuses to date have been able to handle the abovementioned first deformation. In addition, since the abovementioned second deformation has also fallen within the range of the depth of focus of the projection optical system, no special measures have been taken.

However, as photomasks have increased in size, the second deformation in particular has increased even further and deviated from the range of the depth of focus of the projection optical system, which is a problem. In addition, the first deformation has also increased even further. As explained above, although it is obvious that the functions of exposure apparatuses are capable of handling this type of deformation to a certain extent, it is preferable to take some measures to maintain the extremely high quality of exposures of mask patterns of such enlarged photomasks.

With the object of increasing the quality of exposures of mask patterns, inventions have been disclosed in Japanese Unexamined Patent Application Publication No. 2003-292346 (Patent Document 1), Japanese Unexamined Patent Application Publication No. 2004-359544 (Patent Document 2), and Japanese Unexamined Patent Application Publication No. 2005-262432 (Patent Document 3) that improve the planarity of substrates through methods of fabrication that eliminate partially protruding portions of the substrate. However, even if satisfactory planarity is achieved, it is not possible to deal with the problems arising from the deformations of an enlarged substrate that result from its self weight.

The present embodiment solves these problems and is capable of providing: a photomask substrate for fabricating a photomask wherein the glass substrate can be exposed with the mask pattern of the photomask with high accuracy even if the size of the photomask is large; a forming member for fabricating the photomask substrate; and a photomask substrate fabricating method.

Second Embodiment

A plate shaped member made of quartz glass, as in the first embodiment, is prepared and then polished using the same procedure used in the first embodiment.

Next, a forming member 50 that is made of graphite and used for supporting and heat treating the quartz glass plate shaped member is prepared.

Figure 5:
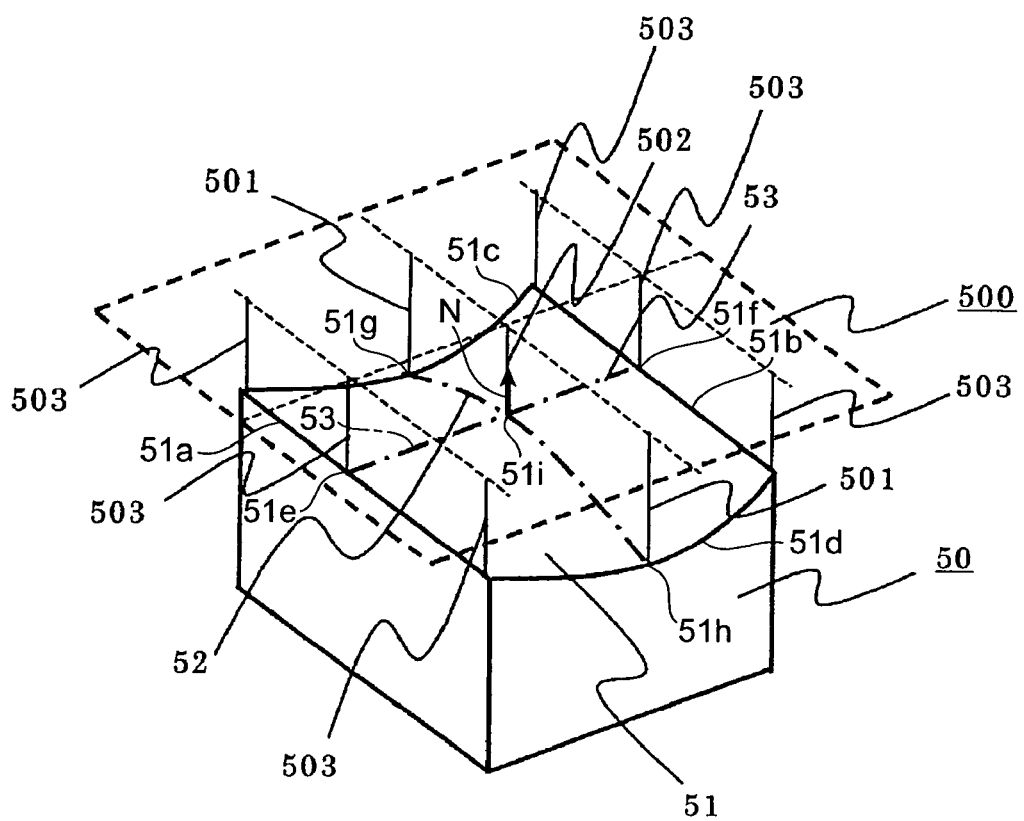
FIG. 5 is a conceptual diagram that shows the photomask substrate forming member according to the second embodiment.

FIG. 5 shows the forming member 50. The thickness of the forming member 50 is approximately 100 mm, and the size of a forming surface 51 is substantially equal to that of the quartz glass plate shaped member itself. The forming surface 51 is fabricated in advance such that its shape is as follows. Namely, if we define a reference plane 500 as an arbitrary plane that is parallel to the vicinity of the center of the forming surface 51 and located at a position sufficiently spaced apart from the forming surface 51 on the near side of the forming surface 51, then distances 501 from the vicinities of the end parts of a first centerline 52, which is one of two centerlines that constitute the forming surface 51, to the reference plane 500, are longer, by approximately 40 µm, than a distance 502 from the vicinity of the center of the first centerline 52 to the reference plane 500, and are substantially the same as the distances 503 between the reference plane 500 and any points in the vicinity of first set sides 51a, 51b, which are one set of sides parallel to the first centerline 52.

Namely, the forming surface 51 is a continuous curved surface and exhibits a square shape that comprises an opposing pair of first set sides 51a, 51b and an opposing pair of second set sides 51c, 51d, which extend such that they communicate with the first set sides 51a, 51b. Here, the intersection point between a second centerline 53, which is a straight line that connects midpoints 51e, 51f of the first set sides 51a, 51b, and the first centerline 52, which is a straight line that connects midpoints 51g, 51h of the second set sides 51c, 51d, is designated as a center point 51i of the forming surface 51. At this time, the reference plane 500 is defined as being both parallel to a tangential plane of the forming surface 51 at the center point 51i of the forming surface 51 and located on the forming surface 51 side of the forming member 50 spaced apart therefrom.

The first distance 502 in a normal line direction N of the tangential plane between the center point 51i of the forming surface 51 and the reference plane 500 is shorter than the second distances 501 in the normal line direction N between the midpoints 51g, 51h of the second set sides 51c, 51d and the reference plane 500.

In addition, on the second set sides 51c, 51d, the distances 503 in the normal line direction N between the reference plane 500 and the portions of the sides 51c, 51d on the first set sides 51a, 51b are shorter than the second distances 501. Accordingly, the distances in the normal line direction N between the reference plane 500 and any points along the first set sides 51a, 51b are the distances 503 and are substantially the same.

In addition, the distances 503 in the normal line direction N between the midpoints 51e, 51f of the first set sides 51a, 51b and the reference plane 500 are substantially equal to the first distance 502. This is because the straight line that connects the midpoints 51e, 51f of the first set sides 51a, 51b passes through the center point 51i of the forming surface 51.

As previously explained, the abovementioned shape is set in order to compensate for the deformation that occurs in the photomask, which is supported by the exposure apparatus, as a result of its self weight. Furthermore, the numerical value of approximately 40 μm varies with the size of the quartz glass plate shaped member. In addition, if a material other than quartz glass is used, then it is preferable to make appropriate modifications in accordance with that material's modulus of elasticity.

Subsequently, the photomask substrate is completed using the same procedure as the one explained in the first embodiment.

The measurement of the degree of planarity of the completed photomask substrate is also performed using the same procedure as the one explained in the first embodiment. Thereby, it is possible to verify that the shape of the support surface of the graphite support member has been substantially transferred to the front surface of the photomask substrate.

Figure 2:
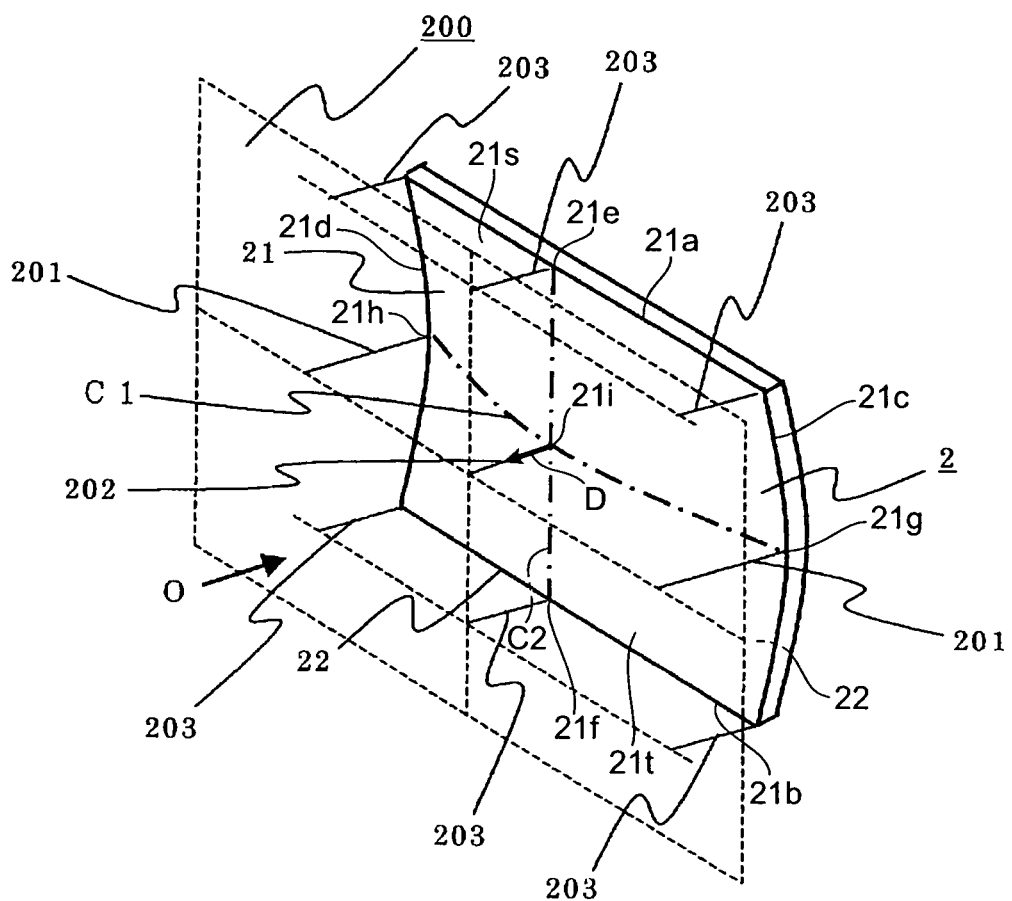
FIG. 2 is a conceptual diagram that shows the photomask substrate according to a second embodiment.

Namely, as shown in FIG. 2, if a completed photomask substrate 2 is held such that a first surface 21, whereon the mask pattern is to be formed, is substantially vertical and if we define a reference plane 200 as an arbitrary plane that is parallel to the vicinity of the center of the first surface 21 and located at a position sufficiently spaced apart from the first surface 21 on the near side of the first surface 21, then, viewed from the observation direction O, distances 201 from the vicinities of end parts of the first centerline C1, which is one of the two centerlines that constitute the first surface 21, to the reference plane 200 are longer by approximately 40 μm than a distance 202 from the vicinity of the center of the first centerline C1 to the reference plane 200 and distances 203 between the reference plane and all points in the vicinities of first set sides 21a, 21b, which are one set of sides parallel to the first centerline C1, are substantially the same.

Namely, the photomask substrate 2 is a plate shaped member with a substantially uniform thickness that has: the first surface 21, which is a continuous curved surface whereon the mask pattern is to be formed; and a second surface 22, which opposes the first surface 21. The first surface 21 exhibits a square shape that comprises the opposing pair of first set sides 21a, 21b and an opposing pair of second set sides 21c, 21d, which extend such that they communicate with the first set sides 21a, 21b. The first surface 21 has support parts 21s, 21t for supporting the photomask substrate 2 at its end parts along the first set sides 21a, 21b.

Here, let us consider the point in time in which the photomask substrate 2 is held such that the first surface 21 is substantially vertical. Furthermore, let the point at which an axis that passes through the center of gravity of the photomask substrate 2 and extends in the thickness direction D of the photomask substrate 2 intersects the first surface 21 be designated as a center point 21i of the first surface 21. Because the photomask substrate 2 is a plate shaped member with a substantially uniform thickness, the center point 21i is an intersection point between the second centerline C2, which is a straight line that connects midpoints 21e, 21f of the first set sides 21a, 21b, and the first centerline C1, which is a straight line that connects midpoints 21g, 21h of the second set sides 21c, 21d.

In addition, the reference plane 200 is defined as a plane that is parallel to a tangential plane of the first surface 21 at the center point 21i and located on the side of the photomask substrate 2 that is closer to the first surface 21 than to the second surface 22.

At this time, the first distance 202 in the thickness direction D between the center point 21i of the first surface 21 and the reference plane 200 is shorter than the second distances 201 in the thickness direction D between the midpoints 21g, 21h of the second set sides 21c, 21d and the reference plane 200. In addition, on the second set sides 21c, 21d, the distances 203 in the thickness direction D between the reference plane 200 and the portions of the sides 21c, 21d on the first set sides 21a, 21b are shorter than the second distances 201. Thereby, the distances 203 in the thickness direction D between the reference plane 200 and any points on the second set sides 21a, 21b are substantially the same. In addition, the distances 203 in the thickness direction D between the midpoints 21e, 21f of the first set sides 21a, 21b and the reference plane 200 are substantially equal to the first distance 202. This is because the straight line that connects the midpoints 21e, 21f of the first set sides 21a, 21b passes through the center point 21i of the first surface 21.

Third Embodiment

A plate shaped member 71 made of quartz glass, as in the first embodiment, is prepared and then polished using the same procedure used in the first embodiment.

Next, a forming member 60 that is made of graphite and used for supporting and heat treating the quartz glass plate shaped member 71 is prepared.

Figure 6:
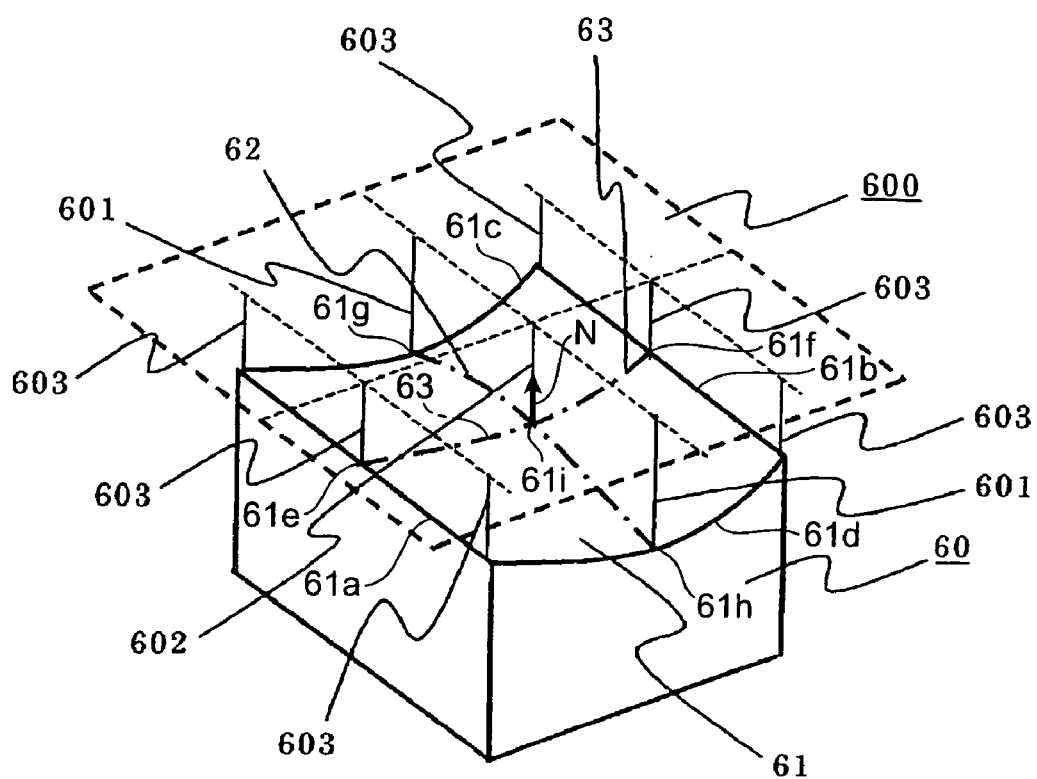
FIG. 6 is a conceptual diagram that shows the photomask substrate forming member according to the third embodiment.

FIG. 6 shows the forming member 60. The thickness of the forming member 60 is approximately 100 mm, and the size of a forming surface 61 is substantially equal to that of the quartz glass plate shaped member 71 itself. The forming surface 61 is fabricated in advance such that its shape is as follows. Namely, if we define a reference plane 600 as an arbitrary plane that is parallel to the vicinity of the center of the forming surface 61 and located at a position sufficiently spaced apart from the forming surface 61 on the near side of the forming surface 61, then distances 601 from the vicinities of the end parts of a first centerline 62, which is one of two centerlines that constitute the forming surface 61, to the reference plane 600, are longer, by approximately 40 μm, than a distance 602 from the vicinity of the center of the first centerline 62 to the reference plane 600, and the distances 603 between the reference plane 600 and any points in the vicinity of first set sides 61a, 61b, which are one set of sides parallel to the first centerline 62, are substantially the same; moreover, the distance 602 between the reference plane 600 and the vicinity of the center part of a second centerline 63, which differs from the first centerline of the two centerlines that constitute the forming surface 61, is longer by approximately 500 μm than the distances 603 between the reference plane 600 and the vicinities of the end parts of the second centerline 63.

Namely, the forming surface 61 is a continuous curved surface and exhibits a square shape that comprises an opposing pair of first set sides 61a, 61b and an opposing pair of second set sides 61c, 61d, which extend such that they communicate with the first set sides 61a, 61b. Here, the intersection point between the second centerline 63, which is a straight line that connects midpoints 61e, 61f of the first set sides 61a, 61b, and the first centerline 62, which is a straight line that connects midpoints 61g, 61h of the second set sides 61c, 61d, is designated as a center point 61i of the forming surface 61. At this time, the reference plane 600 is defined as being both parallel to a tangential plane of the forming surface 61 at the center point 61i of the forming surface 61 and located on the forming surface 61 side of the forming member 60 spaced apart therefrom. As in the above definition, the tangential plane of the forming surface 61 includes all tangents to the forming surface 61 at the center point 61*i*, wherein the center point 61*i* is one point on the forming surface 61.

The first distance 602 in a normal line direction N of the tangential plane between the center point 61*i* of the forming surface 61 and the reference plane 600 is shorter than the second distances 601 in the normal line direction N between the midpoints 61*g*, 61*h* of the second set sides 61*c*, 61*d* and the reference plane 600. In addition, the distances 603 in the normal line direction N between the reference plane 600 and midpoints 61*e*, 61*f* of the first set sides 61*a*, 61*b* are shorter than the first distance 602.

As previously explained, the abovementioned shape is set in order to compensate for the deformation that occurs in the photomask, which is supported by the exposure apparatus, as a result of its self weight. Furthermore, the numerical values of approximately 40 µm and 500 µm vary with the size of the quartz glass plate shaped member 71. In addition, if a material other than quartz glass is used, then it is preferable to make appropriate modifications in accordance with that material's modulus of elasticity.

Subsequently, the photomask substrate is completed using the same procedure as the one explained in the first embodiment. The measurement of the degree of planarity of the completed photomask substrate is also performed using the same procedure as the one explained in the first embodiment. Thereby, it is possible to verify that the shape of the support surface of the graphite support member has been substantially transferred to the front surface of the photomask substrate.

Figure 3:
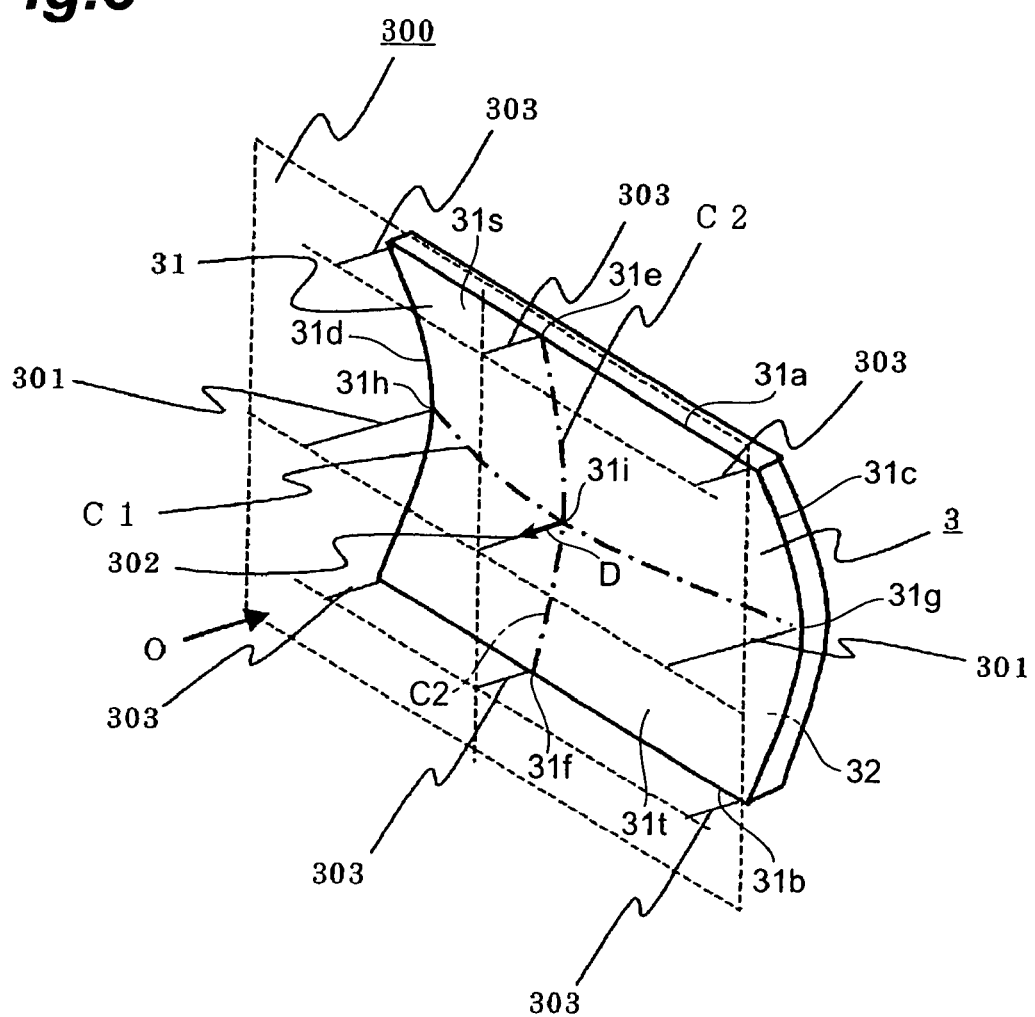
FIG. 3 is a conceptual diagram that shows the photomask substrate according to a third embodiment.

Namely, as shown in FIG. 3, if a completed photomask substrate 3 is held such that a first surface 31, whereon the mask pattern is to be formed, is substantially vertical and if we define a reference plane 300 as an arbitrary plane that is parallel to the vicinity of the center of the first surface 31 and located at a position sufficiently spaced apart from the first surface 31 on the near side thereof, then, viewed from the observation direction O, distances 301 from the vicinities of end parts of the first centerline C1, which is one of the two centerlines that constitute the first surface 31, to the reference plane 300 are longer by approximately 40 µm than a distance 302 from the vicinity of the center of the first centerline C1 to the reference plane 300 and distances 303 between the reference plane 300 and all points in the vicinities of first set sides 31*a*, 31*b*, which are one set of sides parallel to the first centerline C1, are substantially the same; moreover, the distance 302 between the reference plane 300 and the vicinity of the center part of the second centerline C2, which differs from the first centerline of the two centerlines that constitute the forming surface 31, is longer by approximately 500 µm than the distances 303 between the reference plane 300 and the vicinities of the end parts of the second centerline C2.

Namely, the photomask substrate 3 is a plate shaped member with a substantially uniform thickness that has: the first surface 31, which is a continuous curved surface whereon the mask pattern is to be formed; and a second surface 32, which opposes the first surface 31. The first surface 31 exhibits a square shape that comprises the opposing pair of first set sides 31*a*, 31*b* and an opposing pair of second set sides 31*c*, 31*d*, which extend such that they communicate with the first set sides 31*a*, 31*b*. The first surface 31 has support parts 31*s*, 31*t* for supporting the photomask substrate 3 at its end parts along the first set sides 31*a*, 31*b*.

Here, let us consider the point in time in which the photomask substrate 3 is held such that the first surface 31 is substantially vertical. Furthermore, let the point at which an axis that passes through the center of gravity of the photomask substrate 3 and extends in the thickness direction D of the photomask substrate 3 intersects the first surface 31 be designated as a center point 31*i* of the first surface 31. Because the photomask substrate 3 is a plate shaped member with a substantially uniform thickness, the center point 31*i* is an intersection point between the second centerline C2, which is a straight line that connects midpoints 31*e*, 31*f* of the first set sides 31*a*, 31*b*, and the first centerline C1, which is a straight line that connects midpoints 31*g*, 31*h* of the second set sides 31*c*, 31*d*.

In addition, the reference plane 300 is defined as a plane that is parallel to a tangential plane of the first surface 31 at the center point 31*i* and located on the side of the photomask substrate 3 that is closer to the first surface 31 than to the second surface 32.

At this time, the first distance 302 in the thickness direction D between the center point 31*i* of the first surface 31 and the reference plane 300 is shorter than the second distances 301 in the thickness direction D between the midpoints 31*g*, 31*h* of the second set sides 31*c*, 31*d* and the reference plane 300. In addition, the distances 303 in the thickness direction D between the reference plane 300 and the midpoints 31*e*, 31*f* of the first set sides 31*a*, 31*b* are shorter than the first distances 302.

Furthermore, in the first embodiment, the second embodiment, and the third embodiment, the quartz glass plate shaped member is mounted directly on the graphite support member and then heat treatment is performed; however, when heat treatment is performed, a graphite sheet may be inserted between the graphite support member and the quartz glass plate shaped member. In this case, the effect of preventing scratches to the quartz glass plate shaped member can be expected. In addition, while the quartz glass plate shaped member is polished before it is heat treated, it may be polished after it is heat treated. Furthermore, the shape of the support surface of the graphite support member may conversely be concave. In this case, when heat treating the surface whereon the mask pattern is to be formed, the surface on the lower side is heat treated.

In addition, in the photomask substrates 1, 2, 3 according to the first embodiment, the second embodiment, and the third embodiment, marks for discriminating the first surfaces 11, 21, 31 and the second surfaces 12, 22, 32 may be provided.

Fourth Embodiment

Figure 8:
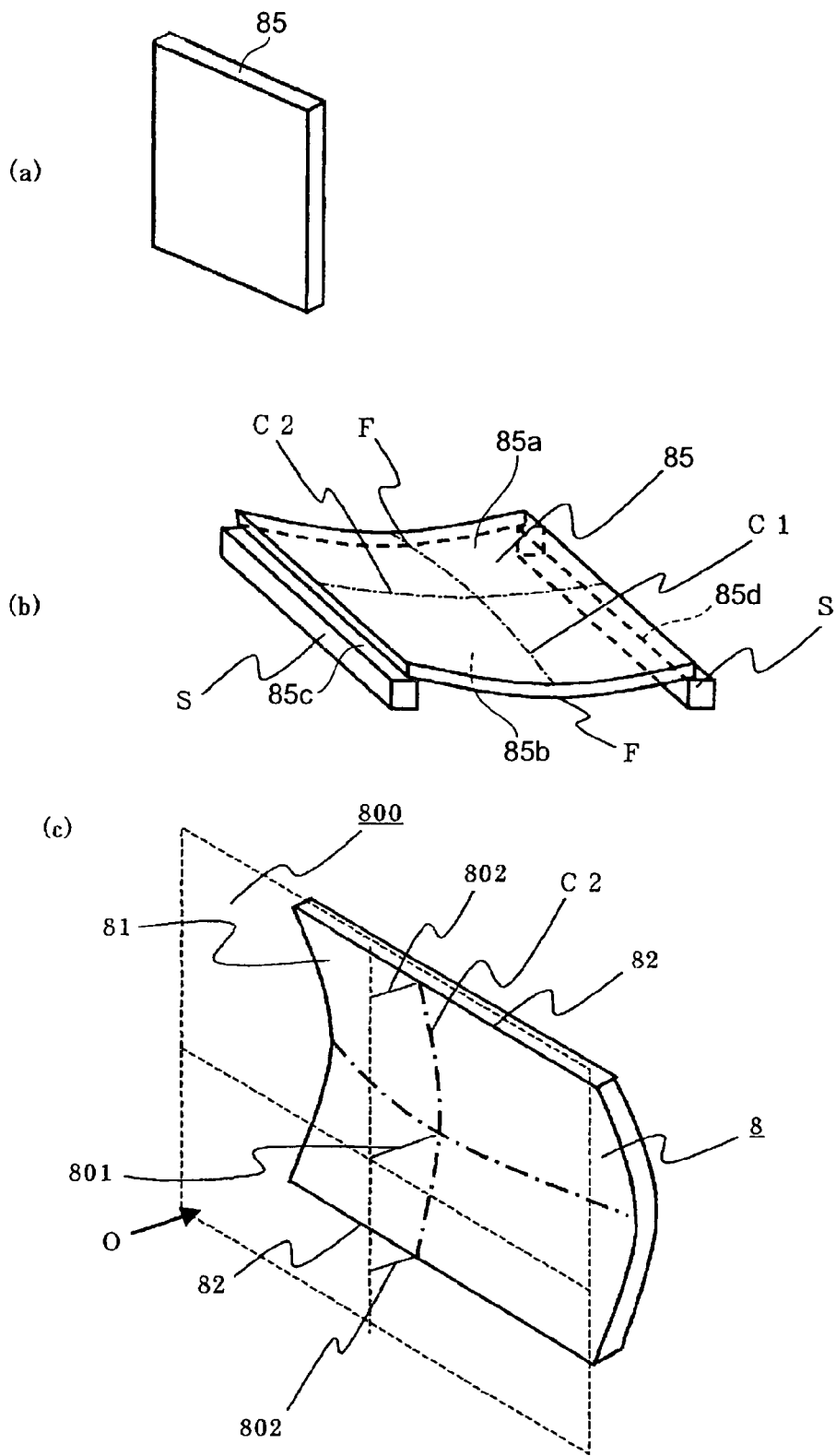
FIG. 8 is a conceptual diagram that shows the photomask substrate fabricating method according to a fourth embodiment.

FIG. 8 includes schematic diagrams that show a photomask substrate fabricating method according to the fourth embodiment.

A quartz glass plate shaped member 85, which is the same as the plate shaped member 71 used in the first embodiment, is prepared and then polished in accordance with the same procedure as that used in the first embodiment (FIG. 8(*a*)).

Next, the quartz glass plate shaped member 85 is stored in the heat treatment furnace. At that time, as shown in FIG. 8(*b*), the quartz glass plate shaped member 85 is supported substantially horizontally by a pair of graphite rod shaped members S at areas in the vicinities of one set of sides of the two sets of opposing sides that constitute a surface 85*b* of the quartz glass plate shaped member 85. The areas supported coincide substantially with the areas at which the photomask, which was completed using the quartz glass plate shaped member 85, is supported by the exposure apparatus. In this state, the quartz glass plate shaped member 85 deforms between the areas supported by the graphite rod shaped members S such that the quartz glass plate shaped member 85 sags downward owing to its self weight; simultaneously, the quartz glass plate shaped member 85 deforms in the vicinities of the center parts of two unsupported sides F such that it sags down even farther.

Next, after the temperature inside the heat treatment furnace is gradually raised to 1,300° C., the internal temperature of the heat treatment furnace is gradually lowered and, upon reaching room temperature, is kept at room temperature for a prescribed time, after which the quartz glass plate shaped member 85 is removed. Thereby, the deformation of the quartz glass plate shaped member 85 further increases from the state of the deformation owing to the self weight explained above.

In accordance with the same procedure, a plurality of the quartz glass plate shaped members 85 is heat treated. At that time, the amount of time during which the temperature is maintained at 1,300° C. varies, and the conditions under which the heat treatment is performed also vary.

Namely, as shown in FIG. 8(*a*), the plate shaped member 85 that is prepared has a substantially uniform thickness and comprises a first surface 85*a*, whereon the mask pattern is to be formed, and the second surface 85*b*, which opposes the first surface 85*a*. Furthermore, as shown in FIG. 8(*b*), the end part areas along one set of sides 85*c*, 85*d* of the two sets of opposing sides that constitute the second surface 85*b* of the plate shaped member 85 are supported by the pair of the graphite rod shaped members S such that the plate shaped member 85 is substantially horizontal. Furthermore, the plate shaped member 85 is disposed inside the heat treatment furnace such that it is supported by the support members S.

The interior of the heat treatment furnace is heated such that the temperature of the plate shaped member 85 reaches a prescribed temperature (e.g., 1,300° C.), after which the temperature of the plate shaped member 85 is gradually lowered. Thus, when the temperature has been lowered to room temperature, the plate shaped member 85 is kept at that temperature for a prescribed time, after which it is removed; thereby, a photomask substrate 8 as shown in FIG. 8(*c*) is obtained.

Next, the degrees of planarity of the quartz glass plate shaped members 85 that underwent heat treatment under various conditions are measured. The degree of planarity is measured using the same procedure as that explained in the first embodiment. Degree of planarity is a value that increases as the amount of time kept at 1,300° C. lengthens. Accordingly, the various heat treatment conditions are searched in order to find the heat treatment condition that satisfies the following condition.

Namely, as shown in FIG. 8(*c*), if the quartz glass plate shaped member 8, which is the quartz glass plate shaped member 85 that underwent heat treatment, is held such that a first surface 81, whereon the mask pattern is to be formed, is substantially vertical and if we define a reference plane 800 as an arbitrary plane that is parallel to the vicinity of the center of the first surface 81 and is disposed at a position sufficiently spaced apart from the first surface 81 on the near side thereof, then the quartz glass plate shaped member 8 is selected wherein, viewed from the observation direction O, the distance 801 between the reference plane 800 and the vicinity of the center part of the centerline C2 of the first surface 81, which intersects at a right angle with one set of sides 82 in the vicinities of the areas supported during the heat treatment, is longer by approximately 500 μm than distances 802 between the reference plane 800 and the vicinities of the end parts of the second centerline C2. Furthermore, the photomask substrate is fabricated under heat treatment conditions derived for and applied to the quartz glass plate shaped member 8.

The photomask substrate thus fabricated has a shape substantially the same as that of the photomask substrate fabricated in the third embodiment. Namely, as shown in FIG. 3, if a completed photomask substrate 3 is held such that a first surface 31, whereon the mask pattern is to be formed, is substantially vertical and if we define a reference plane 300 as an arbitrary plane that is parallel to the vicinity of the center of the first surface 31 and located at a position sufficiently spaced apart from the first surface 31 on the near side thereof, then, viewed from the observation direction O, distances 301 from the vicinities of end parts of the first centerline C1, which is one of the two centerlines that constitute the first surface 31, to the reference plane 300 are longer by approximately 40 μm than a distance 302 from the vicinity of the center of the first centerline C1 to the reference plane 300 and distances 303 between the reference plane 300 and all points in the vicinities of first set sides 31*a*, 31*b*, which are one set of sides parallel to the first centerline C1, are substantially the same; moreover, the distance 302 between the reference plane 300 and the vicinity of the center part of the second centerline C2, which differs from the first centerline of the two centerlines that constitute the forming surface 31, is longer by approximately 500 μm than the distances 303 between the reference plane 300 and the vicinities of the end parts of the second centerline C2.

As previously explained, the abovementioned shape compensates for the deformation that occurs in the photomask, which is supported by the exposure apparatus, as a result of its self weight. Furthermore, the numerical values of approximately 40 μm and 500 μm vary with the size of the quartz glass plate shaped member 71. In addition, if a material other than quartz glass is used, then it is preferable to make appropriate modifications in accordance with that material's modulus of elasticity.

Fifth Embodiment

In the present embodiment, the photomask fabricating method will be explained, referencing FIG. 9.

First, one of the photomask substrates 1, 2, 3 according to the first through third embodiments or the photomask substrate 8 fabricated using the fabricating method according to the fourth embodiment is prepared as a photomask substrate 90. The photomask substrate 90 is cleaned to an extremely high degree. This state is shown in FIG. 9(*a*).

Next, a chrome layer 91 is formed on a first surface 90*a*, which is a mask pattern forming surface of the photomask substrate 90. This state is shown in FIG. 9(*b*).

Next, the chrome layer 91 is coated with a photoresist 92, after which the photoresist 92 is exposed with a desired liquid crystal pattern. This state is shown in FIG. 9(*c*).

Next, the exposed portions of the photoresist 92 are stripped by development, and thereby a resist pattern is formed. This state is shown in FIG. 9(*d*).

Next, etching is performed to etch exposed portions of the chrome layer 91. This state is shown in FIG. 9(*e*).

Next, the remaining photoresist is stripped, thereby forming a photomask wherein the liquid crystal pattern is formed on the front surface by the chrome; lastly, a length measuring instrument is used to inspect whether the liquid crystal pattern is formed correctly, after which precision cleaning is performed to complete the photomask. This state is shown in FIG. 9(*f*).

Namely, the photomask substrate 90, which is one of the photomask substrates 1, 2, 3 according to the first through third embodiments or the photomask substrate 8 fabricated by the fabricating method according to the fourth embodiment, comprises: the first surface 90*a*, whereon the mask pattern is to be formed; and a second surface 90*b*, which opposes the first surface 90*a*. The photomask substrate 90 is supported by the exposure apparatus at a support part of the first surface 90*a*, whereon the mask pattern is formed, and the exposure light is projected from the second surface 90*b* side.

As previously explained, by using the photomask substrate according to the first through third embodiments, exposures can be performed with high accuracy, which makes it possible to fabricate high quality photomasks.

Figure 9:
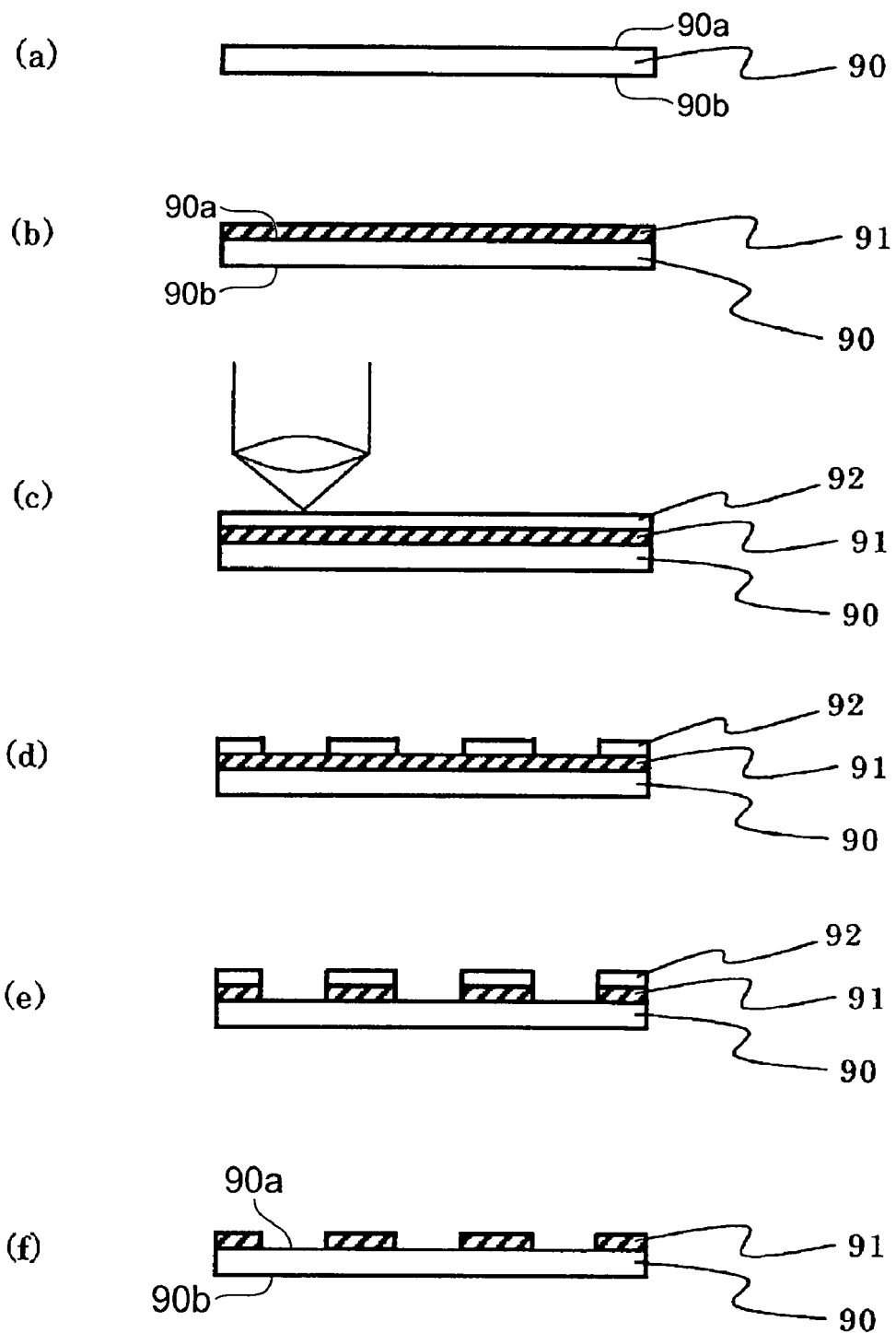
FIG. 9 is a conceptual diagram that shows a photomask fabricating method.

Furthermore, the photomask may be obtained by polishing the photomask substrate, then deforming it by heat treating it using a forming member and the like, and then forming a mask pattern thereon via the processes shown in FIG. 9. Alternatively, the photomask may be obtained by deforming the photomask substrate by heat treating it using a forming member and the like, then polishing it, and then forming a mask pattern thereon via the processes shown in FIG. 9. Alternatively, the photomask may be obtained by polishing the photomask substrate, then forming the mask pattern thereon via the processes shown in FIG. 9, and then deforming it by heat treating it using a forming member and the like. Namely, the order in which the processes—that is, polishing, heat treating, and mask pattern formation—are performed may be changed, and the processes may be combined.

Sixth Embodiment

The present embodiment relates to a liquid crystal pattern exposing method wherein the photomask according to the first through third embodiments is used. The explanation will reference FIG. 10.

Figure 10:
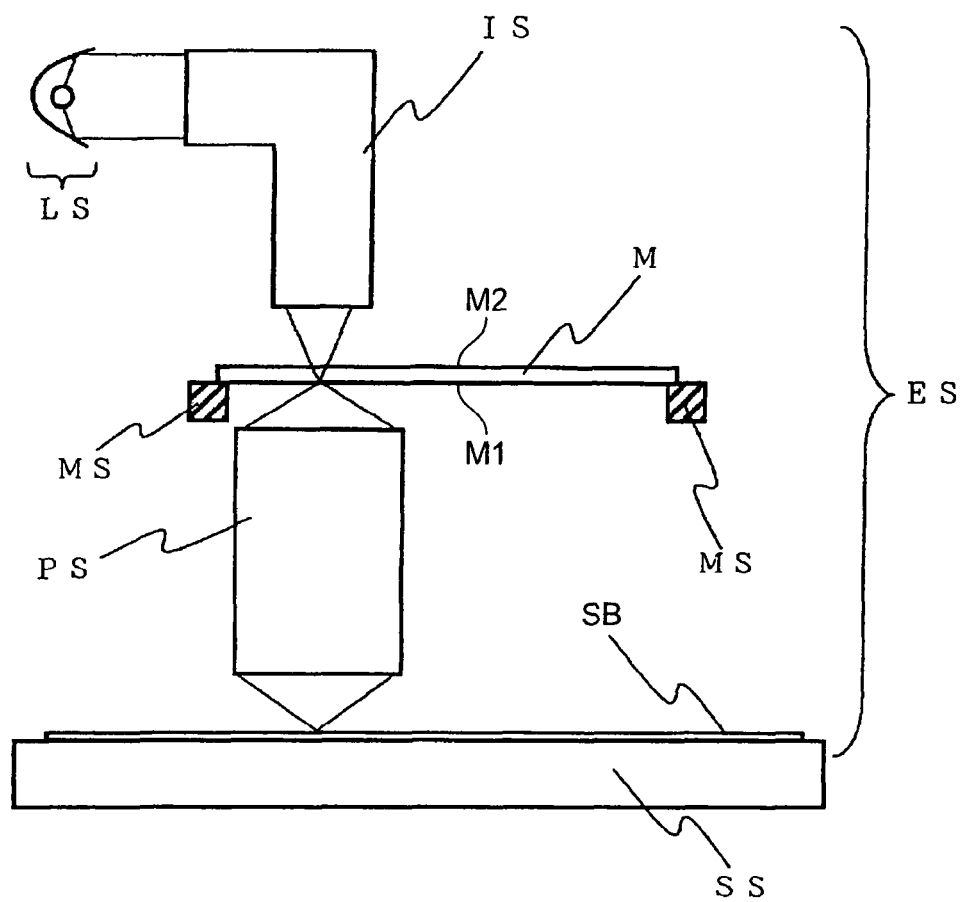
FIG. 10 is a conceptual diagram that shows an exposing method wherein the photomask is used.

FIG. 10 shows a liquid crystal exposure apparatus ES. This exposure apparatus ES comprises a light source LS, an illumination optical system IS, a projection optical system PS, a photomask support members MS, and a substrate stage SS.

A photomask M, which is the photomask fabricated by the fifth embodiment, is disposed on the photomask support members MS of the exposure apparatus ES. In the photomask M, the mask pattern is formed on a lower surface M1, which corresponds to the first surface, and the photomask support members MS supports the photomask M in the vicinities of one set of sides of the two sets of sides that constitute the lower surface M1. Accordingly, in FIG. 10, the other set of sides, which are not supported by the photomask support members MS at two locations, constitute free ends.

In addition, the liquid crystal substrate SB, which is coated with photoresist, is supported on the substrate stage SS of the exposure apparatus ES.

The light that is emitted from the light source LS illuminates the mask pattern via the illumination optical system IS. The illuminated mask pattern is condensed to the substrate SB, which is coated with photoresist in advance, via the projection optical system PS. At that time, the photomask support members MS and the substrate stage SS move synchronously in directions at a right angle to the paper surface.

Namely, in the liquid crystal pattern exposing method wherein the photomask M according to the present embodiment is used, the exposure light is projected from a surface M2, which is on the side opposite the surface M1 whereon the mask pattern is formed, of the photomask M and the exposure is performed in the state wherein the photomask M is supported by the photomask support members MS of the exposure apparatus ES such that the surface M1 whereon the mask pattern is formed faces the substrate SB side.

The photomask substrate according to the first through third embodiments is fabricated into a shape that compensates for the deformation that occurs as a result of the substrate's self weight when the substrate is supported, and therefore the mask pattern on the glass substrate can be exposed with high accuracy even if the photomask is large.

Figure 11:
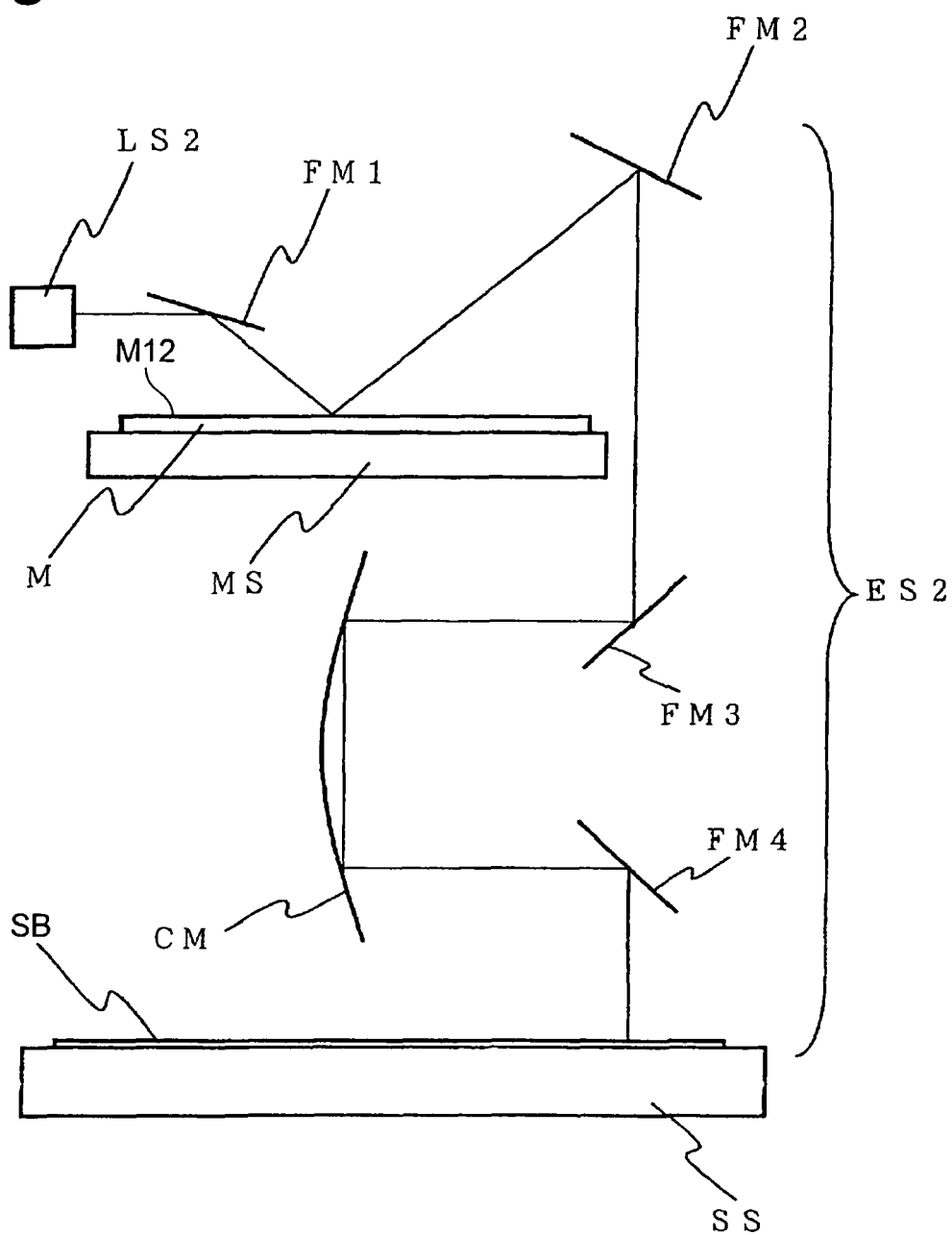
FIG. 11 is a conceptual diagram that shows the exposing method wherein the photomask is used.

In addition, the case wherein an exposure apparatus of another type is used will now be explained, referencing FIG. 11. FIG. 11 shows an exposure apparatus ES2 of another type. This exposure apparatus ES2 comprises a light source LS2, mirrors FM1, FM2, FM3, FM4, a curved mirror CM, the photomask support members MS, and the substrate stage SS.

A photomask M, which is the photomask fabricated by the fifth embodiment, is disposed on the photomask support members MS of the exposure apparatus ES2. In the photomask M, the mask pattern is formed on the upper surface M12, and the photomask support members MS supports the photomask M in the vicinities of one set of sides of the two sets of sides that constitute the lower surface. Accordingly, in FIG. 11, the other set of sides, which are not supported by the photomask support members MS at two locations, constitute free ends.

In addition, the liquid crystal substrate SB, which is coated with photoresist, is supported on the substrate stage SS of the exposure apparatus ES2.

The light emitted from the light source LS2 illuminates the photomask M via the mirror FM1. The light that emerges from the illuminated photomask M transits the mirrors FM2, FM3, the curved mirror CM, and the mirror FM4, and then converges to the substrate SB whereon the photoresist is coated in advance. At that time, the photomask support members MS and the substrate stage SS move synchronously in directions parallel to the paper surface.

Seventh Embodiment

The present embodiment relates to a liquid crystal pattern exposing method wherein any one of the photomasks 1-3 according to the embodiments is used as the photomask M. The explanation will proceed referencing FIG. 13.

Figure 13:
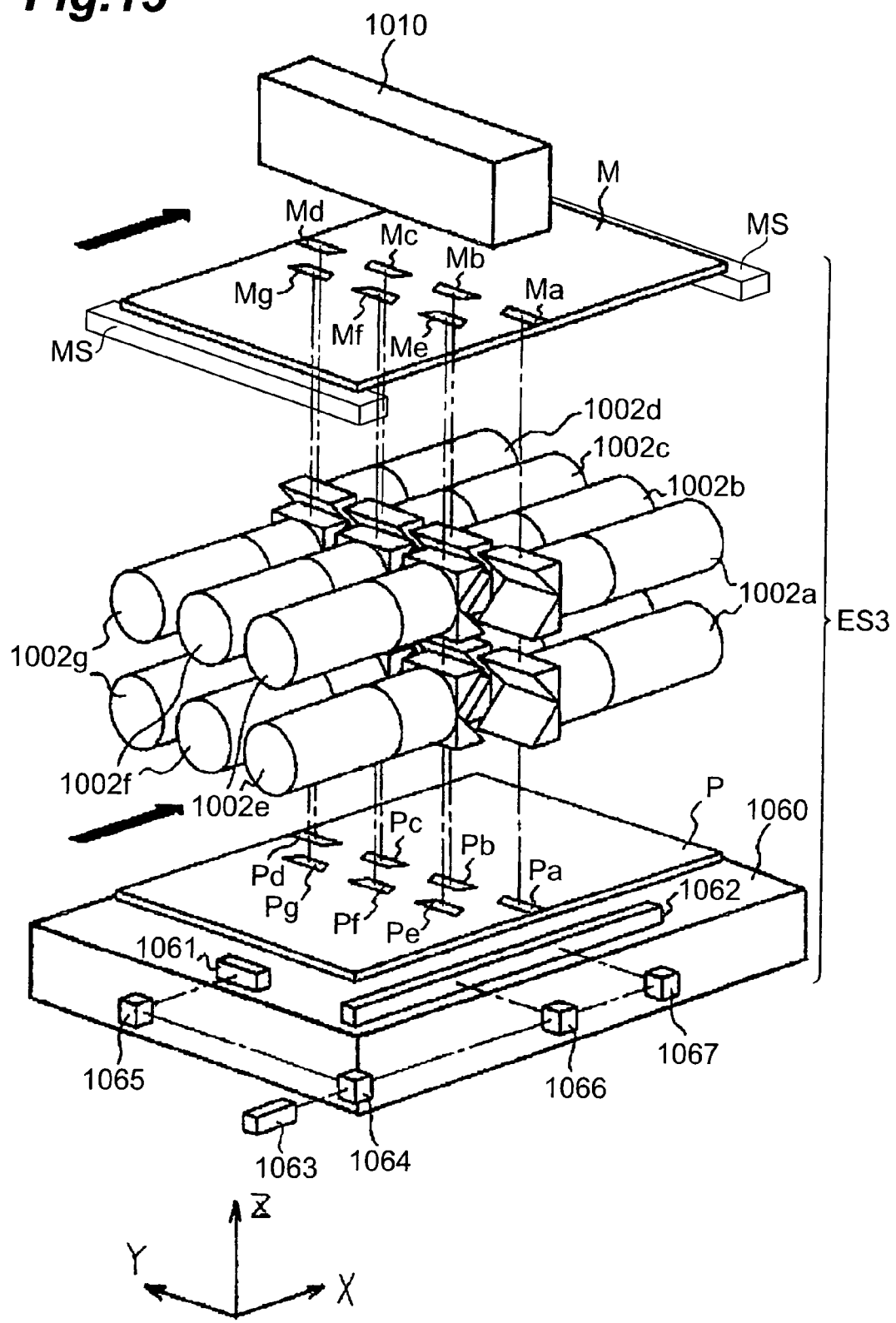
FIG. 13 is a conceptual diagram that shows the exposing method wherein the photomask is used.

FIG. 13 shows a liquid crystal exposure apparatus ES3. This exposure apparatus ES3 comprises an illumination optical system 1010, projection optical systems 1002a-1002g, and a photomask support members MS. Furthermore, in FIG. 13, a coordinate system is defined wherein the directions (i.e., the scanning directions) in which the photomask M, which is provided with a prescribed mask pattern, and the plate P, which is a glass substrate coated with resist, are transported are designated as the X axis, the directions orthogonal to the X axis within the plane of the photomask M are designated as the Y axis, and the normal line directions of the photomask M are designated as the Z axis.

In FIG. 13, the exposure light that emerges from the illumination optical system 1010 evenly illuminates the photomask M within the XY plane in the figure. A system that comprises a light source, such as a mercury lamp, that supplies exposure light, such as g-line (435 nm) or i-line (365 nm) light, can be used as the illumination optical system 1010. The exposure light forms illumination areas Ma-Mg, which are images of the openings of field stops of the illumination optical system 1010.

The photomask M is disposed such that its second surface faces upward in FIG. 1, namely, toward the illumination optical system 1010, and its first surface, whereon the mask pattern is formed, faces toward the projection optical systems 1002a-1002g, namely, toward the plate P. The photomask M is disposed such that its first set sides are parallel to the Y axial directions and its second set sides are parallel to the X axial directions. In addition, the photomask M is supported by the photomask support members MS at support parts on the first surface at end parts along the first set sides of the photomask M. Moreover, the second set sides of the photomask M are free ends.

The plurality of the projection optical systems 1002a-1002g is disposed below the photomask M. The projection optical systems 1002a-1002g have field of illumination areas Ma-Mg, which are defined by the field stops inside the projection optical systems 1002a-1002g. The images of these field of illumination areas Ma-Mg are formed as erect images at unity magnification in exposure areas Pa-Pg on the plate P. Here, the projection optical systems 1002*a*-1002*d* are provided such that the field of illumination areas Ma-Md are arrayed in the Y directions in the figure. In addition, the projection optical systems 1002*e*-1002*g* are provided such that the field of illumination areas Me-Mg are arrayed in the Y directions at positions in the X directions in the figure other than the positions of the field of illumination areas Ma-Md.

The projection optical systems 1002*a*-1002*d* form on the plate P the exposure areas Pa-Pd, which are arrayed in the Y directions in the figure, and the projection optical systems 1002*e*-1002*g* form the exposure areas Pe-Pg, which are arrayed in the Y directions, at positions other than the positions of the exposure areas Pa-Pd. These exposure areas Pa-Pg are erect images of the field of illumination areas Ma-Mg at unity magnification.

Here, the photomask M is mounted on the photomask support members MS and the plate P is mounted on a plate stage 1060. Here, the photomask support members MS and the plate stage 1060 are moved synchronously in the X directions in the figure. Thereby, a so-called scanning exposure is performed wherein the images of the photomask M illuminated by the illumination optical system 1010 are successively transferred to the plate P. Upon completion of the scan of the entire surface of the photomask M in the field of illumination areas Ma-Mg via the movement of the photomask M, the image of the photomask M will have been transferred over the entire surface of the plate P. A laser interferometer (not illustrated) that measures the amount of movement of the photomask support members MS is provided thereto. The laser interferometer measures the positional coordinates of the photomask support members MS using movable mirrors, and the position of the photomask support members MS is controlled based on the measured positional coordinates.

A reflective member 1061, which has a reflective surface along the Y axis, and a reflective member 1062, which has a reflective surface along the X axis, are provided on the plate stage 1060. In addition, the interferometer on the main body side of the exposure apparatus is provided with: a laser light source 1063, which supplies laser light, such as light from a He—Ne laser (633 nm); a beam splitter 1064, which splits the laser light from the laser light source 1063 into laser light for measurement in the X directions and laser light for measurement in the Y directions; a prism 1065, which is for projecting the laser light from the beam splitter 1064 to the reflective member 1061; and prisms 1066, 1067, which are for projecting the laser light from the beam splitter 1064 to two points on the reflective member 1062. Thereby, the position of the stage in the X and Y directions and the rotation of the stage within the XY plane can be detected. Furthermore, in FIG. 13, the laser light reflected by the reflective members 1061, 1062 is interfered with a reference laser light, and the interfered light is detected by a detection system (not illustrated).

In the exposure apparatus ES3, in addition to the photomask support members MS that support the photomask M, an interferometer is needed, and it is also necessary to maintain a space both above and below the photomask M. Consequently, it is preferable to support the photomask M in the vicinities of only one pair of the two pairs of opposing sides of the photomask M. In such a case, the problem of deformation, particularly of the second deformation, of the photomask M as a result of its self weight, as the photomask M increases in size as discussed above becomes marked. In contrast, because the photomask M is one of the photomasks 1-3 according to the abovementioned embodiments, an effect is obtained wherein the deformation resulting from self weight that exceeds the depth of focus of the autofocus function of the projection optical system is compensated for. Consequently, with the exposure apparatus ES3, exposures of high accuracy become possible.

Because the photomask substrate according to the first through third embodiments is fabricated into a shape such that the deformation resulting from self weight when the substrate is supported is compensated for, the mask pattern on the glass substrate can be exposed with high accuracy even if the photomask is large.

The above text explained the details of the preferred embodiments of the present invention based on the drawings, but the specific constitution is not limited to these embodiments, and it is understood that variations and modifications may be effected without departing from the spirit and scope of the invention. For example, the size of the photomask substrate is not limited to the size recited in the above embodiments.

In addition, the photomask substrate may be made of something other than quartz glass. The photomask substrate is not limited to a photomask for liquid crystal exposures, and may be used in photomasks for other devices. In addition, the forming member of the photomask is not limited to graphite.

The embodiment according to the present invention can provide: a photomask, which is used for exposing a very fine mask pattern of a flat panel display, particularly a large liquid crystal display, with high accuracy; a photomask substrate; a photomask substrate fabricating method; and an exposing method wherein the photomask is used.

What is claimed is:

1. A photomask substrate that consists of a plate shaped member with a substantially uniform thickness, comprising:
    a first surface, which is a continuous curved surface and whereon a mask pattern is to be formed; and
    a second surface, which opposes the first surface;
    wherein, the first surface exhibits a square shape that comprises a first pair of opposing sides of the four sides surrounding the first surface and a second pair of opposinq sides of the four sides surrounding the first suface, which extend such that they communicate with the first pair of opposing sides, and a support part, which is for supporting the photomask substrate at its end parts along the first pair of opposing sides;
    when the photomask substrate is held such that the first surface is in a substantially vertical state, the point at which the axis that passes through the center of gravity of the photomask substrate and extends in the thickness direction of the photomask substrate intersects the first surface is designated as a center point of the first surface; and
    if a reference plane that is parallel to a tangential plane of the first surface at the center point is defined on the photomask substrate side that is closer to the first surface than to the second surface, then a first distance in the thickness direction between the reference plane and the center point of the first surface is shorter than second distances in the thickness direction between the reference plane and the midpoints of the second pair of opposing sides.

2. A photomask substrate according to claim 1, wherein when the photomask substrate is held such that the first surface is substantially in the vertical state, the distances in the thickness direction between the reference plane and the portions of the second pair of opposing sides on the first pair of opposing sides are shorter than the second distances.

3. A photomask substrate according to claim 1, wherein when the photomask substrate is held such that the first surface is substantially in the vertical state, the distances in the thickness direction between the reference plane and any points along the first pair of opposing sides are substantially the same.

4. A photomask substrate according to claim 1, wherein when the photomask substrate is held such that the first surface is substantially in the vertical state, the distances in the thickness direction between the reference plane and midpoints of the first pair of opposing sides are substantially the same as the first distance.

5. A photomask substrate according to claim 1, wherein when the photomask substrate is held such that the first surface is substantially in the vertical state, the distances in the thickness direction between the reference plane and the midpoints of the first pair of opposing sides are shorter than the first distance.

6. A photomask substrate according to claim 1, wherein when the photomask substrate is held such that the first surface is substantially in the vertical state, the distances in the thickness direction between the reference plane and any points along the second pair of opposing sides are substantially the same.

7. A photomask substrate according to claim 1, comprising:
marks for discriminating the first surface and the second surface.

8. A photomask substrate according to claim 1, wherein the substrate is made of quartz glass.

9. A photomask fabricated using the photomask substrate according to claim 1, wherein a mask pattern is formed on the first surface; and the photomask is supported by an exposure apparatus at the support parts such that the exposure light is projected from the second surface side.

10. An exposing method that exposes a wafer with the mask pattern formed on the photomask according to claim 9, comprising the step of:
performing an exposure in the state wherein the support parts are supported by a photomask support member of the exposure apparatus such that the exposure light is projected from the surface on the side opposite the surface whereon the mask pattern of the photomask is formed, and the surface whereon the mask pattern is formed faces toward the wafer.

11. A photomask substrate, wherein a first surface for forming a mask pattern is a rectangle with a diagonal line length of 1,200 mm or greater;
wherein, the first surface comprises a first pair of opposing sides of the four sides surrounding the first surface and a second pair of opposing sides of the four sides surrounding the first surface, which extend such that they communicate with the first pair of opposing sides, and a first center line, which is a straight line that connects midpoints of the second pair of opposing sides, and a second center line, which is a straight line that connects midpoints of the first pair of opposing sides;
the thickness of the photomask substrate is 8 mm or greater;
the photomask substrate is held in the state wherein the first surface is substantially vertical; and
if a reference plane is defined as a plane that is parallel to a tangential plane at the center point of the first surface and is located at a position that is spaced apart from the first surface on the near side of the first surface, then distances from the midpoints of the second pair of opposing sides to the reference plane are longer by 30-100 μm than a distance from the center point of the first centerline to the reference plane.

12. A photomask substrate according to claim 11, wherein the distances from any points of the first pair of opposing sides, to the reference plane are substantially the same.

13. A photomask substrate according to claim 11, wherein the distances from any points of the second centerline to the reference plane are substantially the same.

14. A photomask substrate according to claim 11, wherein the distance from a center point of the second centerline to the reference plane is longer by 150-1500 μm than the distances from the midpoints of the first pair of opposing sides to the reference plane.

15. A photomask substrate according to any one claim of claim 11 through claim 14, wherein a second surface, which opposes the first surface, is substantially parallel to the first surface.

16. A photomask substrate according to any one claim of claim 11 through claim 14, comprising:
marks for discriminating the first surface and the second surface.

17. A photomask substrate according to claim 11, wherein the substrate is made of quartz glass.

18. A photomask fabricated using the photomask substrate according to claim 11, wherein a mask pattern is formed on the first surface; and support portions, at which the photomask is supported by an exposure apparatus, are in the vicinities of the first pair of opposing sides.

19. An exposing method that performs an exposure using the photomask according to claim 18, comprising the step of:
performing an exposure in the state wherein the support portions are supported by a photomask support member of the exposure apparatus such that the surface whereon the mask pattern of the photomask is formed faces downward.

* * * * *

UNITED STATES PATENT AND TRADEMARK OFFICE
CERTIFICATE OF CORRECTION

| | | |
|---|---|---|
| PATENT NO. | : 8,153,336 B2 | Page 1 of 1 |
| APPLICATION NO. | : 12/591121 | |
| DATED | : April 10, 2012 | |
| INVENTOR(S) | : Tetsuya Abe et al. | |

It is certified that error appears in the above-identified patent and that said Letters Patent is hereby corrected as shown below:

Column 20, Lines 38-39, In Claim 1, delete "opposinq" and insert -- opposing --, therefor.

Column 20, Line 39, In Claim 1, delete "suface," and insert -- surface, --, therefor.

Signed and Sealed this
Eighteenth Day of September, 2012

David J. Kappos
*Director of the United States Patent and Trademark Office*